United States Patent
Lee et al.

(10) Patent No.: US 8,836,057 B2
(45) Date of Patent: Sep. 16, 2014

(54) MAGNETORESISTIVE ELEMENTS HAVING PROTRUSION FROM FREE LAYER AND MEMORY DEVICES INCLUDING THE SAME

(71) Applicant: Samsung Electronics Co., Ltd., Suwon-Si (KR)

(72) Inventors: Sung-chul Lee, Osan-si (KR); Ung-hwan Pi, Seoul (KR); Kwang-seok Kim, Seongnam-si (KR); Kee-won Kim, Suwon-si (KR); Young-man Jang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/665,824

(22) Filed: Oct. 31, 2012

(65) Prior Publication Data
US 2013/0307098 A1 Nov. 21, 2013

(30) Foreign Application Priority Data
May 18, 2012 (KR) .................. 10-2012-0053157

(51) Int. Cl.
*H01L 29/82* (2006.01)

(52) U.S. Cl.
USPC ........... 257/421; 257/422; 257/423; 257/424; 257/427; 257/E29.323; 438/3; 365/157; 365/158; 365/171; 365/173; 360/324.2; 360/326

(58) Field of Classification Search
CPC ....... H01L 43/08; H01L 27/22; H01L 43/065; G11C 11/16
USPC ........ 257/20, 414, 421–427, E29.323; 438/3; 365/157–158, 171–173; 360/324–326
See application file for complete search history.

(56) References Cited

U.S. PATENT DOCUMENTS

| | | | |
|---|---|---|---|
| 2002/0036873 A1* | 3/2002 | Hara et al. | 360/321 |
| 2002/0105035 A1* | 8/2002 | Sandhu et al. | 257/375 |
| 2003/0107057 A1* | 6/2003 | Komori | 257/241 |
| 2008/0089118 A1* | 4/2008 | Kajiyama | 365/158 |
| 2010/0003767 A1* | 1/2010 | Cho | 438/3 |
| 2013/0140657 A1* | 6/2013 | Lee et al. | 257/421 |
| 2013/0140660 A1 | 6/2013 | Fukami et al. | |

FOREIGN PATENT DOCUMENTS

| | | |
|---|---|---|
| JP | 2008147488 A | 6/2008 |
| KR | 10-0952919 B1 | 4/2010 |
| KR | 10-0975803 B1 | 8/2010 |
| KR | 10-0979351 B1 | 8/2010 |
| KR | 10-1004506 B1 | 12/2010 |
| WO | WO-2012002156 A1 | 1/2012 |

OTHER PUBLICATIONS

European Search Report dated Sep. 30, 2013, issued in European Application No. 13154646.7.

* cited by examiner

*Primary Examiner* — Jami M Valentine
(74) *Attorney, Agent, or Firm* — Harness, Dickey & Pierce, P.L.C.

(57) ABSTRACT

Magnetoresistive elements, and memory devices including the same, include a pinned layer having a fixed magnetization direction, a free layer corresponding to the pinned layer, and a protruding element protruding from the free layer and having a changeable magnetization direction. The free layer has a changeable magnetization direction. The protruding element is shaped in the form of a tube. The protruding element includes a first protruding portion and a second protruding portion protruding from ends of the free layer facing in different directions.

26 Claims, 30 Drawing Sheets

MAGNETORESISTIVE ELEMENTS HAVING PROTRUSION FROM FREE LAYER AND MEMORY DEVICES INCLUDING THE SAME

CROSS-REFERENCE TO RELATED APPLICATIONS

This application claims the benefit of priority under 35 U.S.C. §119 from Korean Patent Application No. 10-2012-0053157, filed on May 18, 2012, in the Korean Intellectual Property Office, the disclosure of which is incorporated herein by reference in its entirety.

BACKGROUND

1. Field

The present disclosure relates to magnetoresistive elements and memory devices including the same.

2. Description of the Related Art

Magnetic random access memories (MRAMs) are memory devices that store data by using resistance variation of a magnetic tunneling junction (MTJ) element. Resistance of the MTJ element varies according to the magnetization direction of a free layer. In other words, when the magnetization direction of a free layer is identical with that of a pinned layer, the MTJ element has low resistance. When the magnetization direction of the free layer is opposite to that of the pinned layer, the MTJ element has high resistance. If the MTJ element has low resistance, data may correspond to '0'. On the other hand, if the MTJ element has high resistance, data may correspond to '1'. MRAMs attract attention as one of the next-generation non-volatile memory devices due to their merits, for example, non-volatility, high-speed operation, and/or high endurance.

Thermal stability of data stored in an MTJ element is related to an energy barrier (Eb) of a free layer. It has been known that, when a free layer is an in-plane magnetic anisotropic material layer and $Eb/k_BT$ (where $k_B$ is the Boltzmann constant and T is the absolute temperature) is about 60, the thermal stability of the MTJ element is ensured for about 10 years. In general, the feature size of the MTJ element (that is, the feature size of the free layer) should be at least about 40 nm for ensuring a relatively high $Eb/k_BT$ of about 60, although it may slightly vary according to the thickness of the free layer. This means that it is difficult to reduce the feature size of the MTJ element to less than 40 nm. Thus, it is difficult to increase the recording density of an MRAM to a set level.

SUMMARY

The present disclosure relates to magnetoresistive elements and memory devices including the same.

Provided are magnetoresistive elements suitable to be scaled down.

Provided are magnetoresistive elements having excellent thermal stability.

Provided are magnetoresistive elements that contribute to high integration and high performance of devices (for example, memory devices).

Provided are devices (for example, memory devices) including the magnetoresistive elements.

According to example embodiments, a magnetoresistive element includes a pinned layer having a fixed magnetization direction, a free layer corresponding to the pinned layer wherein the free layer has a changeable magnetization direction, and a protruding element protruding from the free layer and having a changeable magnetization direction, wherein the protruding element is shaped in the form of a tube.

The protruding element has a closed fence structure.

The protruding element may protrude in a direction perpendicular to an upper or lower surface the free layer.

The protruding element may protrude from an edge of the free layer.

The protruding element may protrude toward the pinned layer.

The protruding element may surround the pinned layer.

If the protruding element protrudes toward the pinned layer, the protruding element may have a structure surrounding the pinned layer.

The protruding element may protrude away from the pinned layer.

The protruding element may have an uniform protrusion length.

The protruding element may include a first portion and a second portion, and a protrusion length of the first portion may be different than a protrusion length of the second portion.

The protruding element may include first portions along a first set of opposing sidewalls of the free layer and second portions along a second set of opposing sidewalls of the free layer alternately arranged with the first set of opposing sidewalls. The first and second portions may protrude to a same height in a direction non-parallel to an upper or lower surface of the free layer.

The protruding element may include first portions along a first set of opposing sidewalls of the free layer and second portions along a second set of opposing sidewalls of the free layer alternately arranged with the first set of opposing sidewalls. A height of the first portions and a height of the second portions in a direction non-parallel to an upper or lower surface of the free layer may be different.

The free layer may have a rectangular shape.

The protruding element may include first portions corresponding to short sides of the free layer and second portions corresponding to long sides of the free layer, wherein a protrusion length of the first portions is identical to a protrusion length of the second portions.

The protruding element may include first portions corresponding to short sides of the free layer and second portions corresponding to long sides of the free layer, wherein a protrusion length of the first portions is different than a protrusion length of the second portions. The protrusion length of the second portions may be less than the protrusion length of the first portions.

The free layer may have an oval shape.

The protruding element may include first portions corresponding to both long-axis directional ends of the free layer and second portions corresponding to both short-axis directional ends of the free layer, wherein a protrusion length of the first portions is identical to a protrusion length of the second portions.

The protruding element may include first portions corresponding to both long-axis directional ends of the free layer and second portions corresponding to both short-axis directional ends of the free layer, wherein a protrusion length of the first portions is different than a protrusion length of the second portions. The protrusion length of the second portions may be less than the protrusion length of the first portions.

At least a portion of the protruding element may have a protrusion length equal to or greater than about 8 nm.

The free layer and the pinned layer may have in-plane magnetic anisotropy. In this case, the protruding element may have in-plane magnetic anisotropy.

The free layer and the pinned layer may have perpendicular magnetic anisotropy. In this case, the protruding element may have perpendicular magnetic anisotropy.

The magnetoresistive element may further include a separation layer between the free layer and the pinned layer.

The pinned layer may be a first pinned layer, and the magnetoresistive element may further include a second pinned layer spaced apart from the first pinned layer, and a spacer between the first pinned layer and the second pinned layer.

The first pinned layer, the second pinned layer, and the spacer may collectively constitute a synthetic antiferromagnetic (SAF) structure.

According to example embodiments, a magnetic device or an electronic device includes the magnetoresistive element.

According to other example embodiments, a memory device includes at least one memory cell, wherein the at least one memory cell includes the magnetoresistive element.

The memory cell may further include a switching element connected to the magnetoresistive element.

The memory device may be a magnetic random access memory (MRAM).

The memory device may be a spin transfer torque magnetic random access memory (STT-MRAM).

According to other example embodiments, a magnetoresistive element includes a pinned layer having a fixed magnetization direction, a free layer corresponding to the pinned layer wherein the free layer has a changeable magnetization direction, and a protruding element protruding from the free layer, wherein the protruding element includes a first protruding portion and a second protruding portion protruding from ends of the free layer facing in different directions.

The first protruding portion may protrude from at least one of the ends of the free layer facing in a first direction, and the second protruding portion may protrude from at least one of the ends of the free layer facing in a second direction non-parallel with the first direction.

A protrusion length of the first protruding portion may be the same as a protrusion length of the second protruding portion.

The first and second protruding portions may protrude to a same height in a direction non-parallel to an upper or lower surface of the free layer.

A height of the first protruding portion and a height of the second protruding portion in a direction non-parallel to an upper or lower surface of the free layer may be different.

A protrusion length of the first protruding portion may be different than a protrusion length of the second protruding portion.

A width of the first protruding portion may be less than a width of the second protruding portion. In this case, the protruding length of the second protruding portion may be less than the protrusion length of the first protruding portion.

The protruding element may protrude downward from the free layer.

The protruding element may protrude upward from the free layer.

At least a portion of the protruding element may have a protrusion length equal to or greater than about 8 nm.

At least one of the free layer and the pinned layer may have a tetragonal or oval shape. Here, the tetragon may be a rectangle.

The free layer and the pinned layer may have in-plane magnetic anisotropy. In this case, the protruding element may have in-plane magnetic anisotropy.

The free layer and the pinned layer may have perpendicular magnetic anisotropy. In this case, the protruding element may have perpendicular magnetic anisotropy.

The magnetoresistive element may further include a separation layer disposed between the free layer and the pinned layer.

The pinned layer may be a first pinned layer, and the magnetoresistive element may further include a second pinned layer spaced apart from the first pinned layer, and a spacer disposed between the first pinned layer and the second pinned layer.

The first pinned layer, the second pinned layer, and the spacer may collectively constitute a synthetic antiferromagnetic (SAF) structure.

According to example embodiments, a magnetic device or an electronic device includes the magnetoresistive element.

According to other example embodiments, a memory device includes at least one memory cell, wherein the at least one memory cell includes a memory device including the magnetoresistive element.

The memory cell may further include a switching element connected to the magnetoresistive element.

The memory device may be a magnetic random access memory (MRAM).

The memory device may be a spin transfer torque magnetic random access memory (STT-MRAM).

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1A:
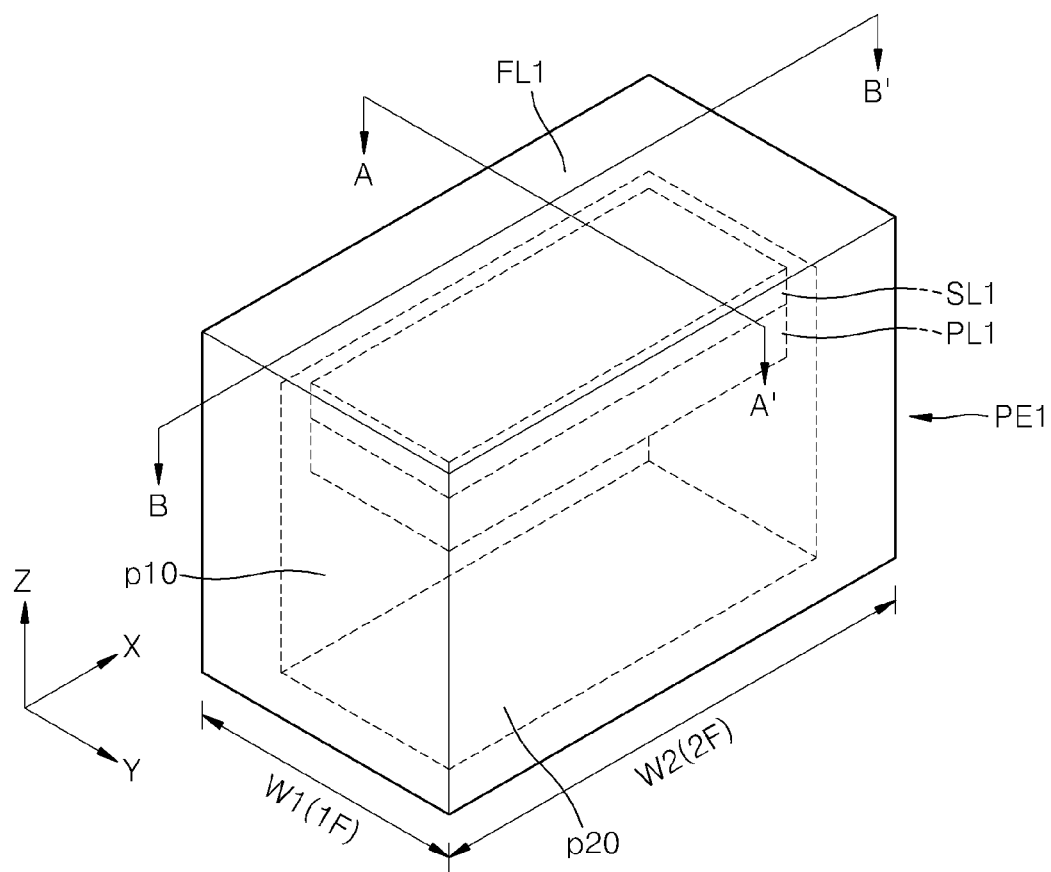
FIG. 1A is a perspective view of a magnetoresistive element according to example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter, magnetoresistive elements according to example embodiments and devices (memory devices) including the same will be described in detail with reference to the accompanying drawings. In the accompanying drawings, thicknesses and sizes of layers or regions are exaggerated for clarity.

Figure 1B:
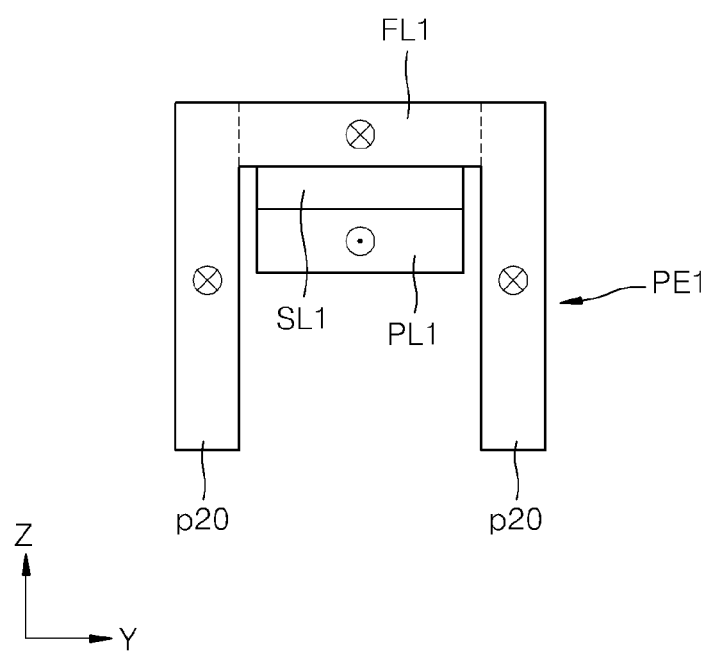
FIG. 1B is a cross-sectional view taken along a line A-A' of FIG. 1A.

FIG. 1A is a perspective view of a magnetoresistive element according to example embodiment. FIG. 1B is a cross-sectional view taken along a line A-A' of FIG. 1A, and FIG. 1C is a cross-sectional view taken along a line B-B' of FIG. 1A.

Figure 1C:
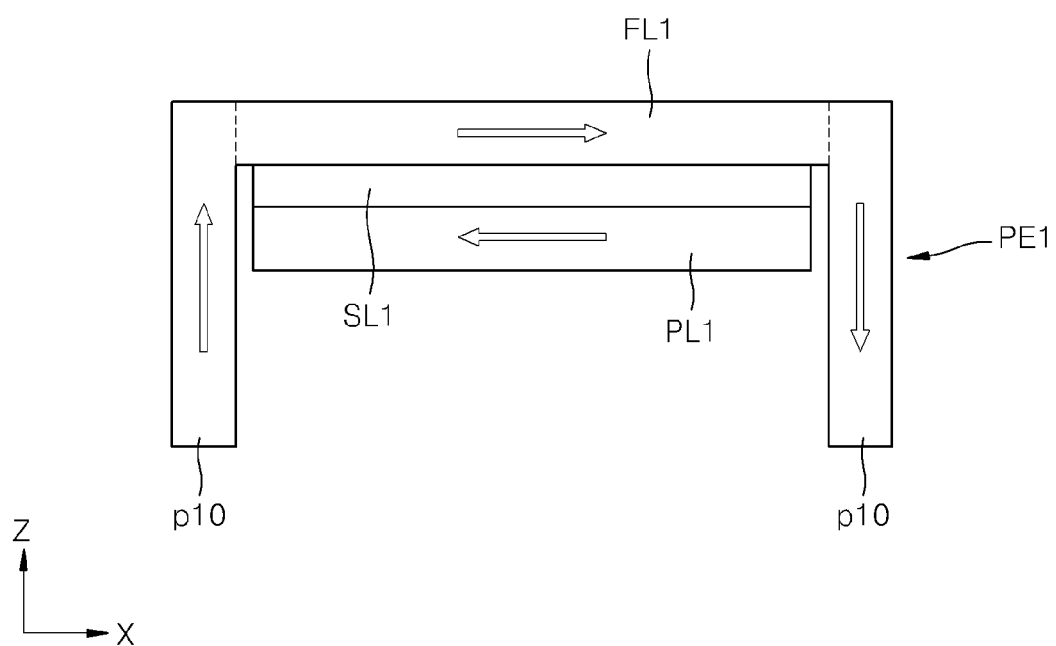
FIG. 1C is a cross-sectional view taken along a line B-B' of FIG. 1A.

Referring to FIGS. 1A to 1C, the magnetoresistive element may include a pinned layer PL1, a free layer FL1, and a separation layer SL1 between the pinned layer PL1 and the free layer FL1. The pinned layer PL1 is a magnetic layer that has a fixed magnetization direction and may be formed of a ferromagnetic material. The ferromagnetic material may include at least one of Co, Fe, and Ni and another element, for example, B, Cr, Pt, and Pd. The free layer FL1 is a magnetic layer that has a changeable magnetization direction and may be formed of a ferromagnetic material including at least one of Co, Fe, and Ni. The ferromagnetic material for the free layer FL1 may further include another element, for example, B, Cr, Pt, and Pd. The free layer FL1 and the pinned layer PL1 may be formed of the same material or different materials. The separation layer SL1 may be formed of an insulating material. For example, the separation layer SL1 may include an insulating material (e.g., Mg oxide and Al oxide). When such materials, particularly, Mg oxide, are used to form the separation layer SL1, a magnetoresistance ratio (i.e., MR ratio) may be increased. However, the material used to form the separation layer SL1 is not limited to the insulating material. If required, the separation layer SL1 may be formed of a conductive material. In this regard, the separation layer SL1 may include at least one conductive material (e.g., a metal) selected from the group consisting of Ru, Cu, Al, Au, Ag, and any mixture thereof. A thickness of the separation layer SL1 may be about 5 nm or less, for example, about 3 nm or less.

A protruding element PE1 that protrudes from the free layer FL1 may be provided. The protruding element PE1 may have a closed fence structure. That is, the protruding element PE1 may have a structure that surrounds a region. The protruding element PE1 may be an element protruding from an edge of the free layer FL1. The protruding element PE1 may protrude in a direction perpendicular (or, alternatively, a direction non-parallel) to the free layer FL1. In this regard, the "direction perpendicular to the free layer FL1" does not necessarily indicate a direction in which the angle between the protruding element PE1 and the free layer FL1 is exactly 90°. If the protruding element PE1 extends from the free layer FL1 upward or downward at a set angle, the protruding element PE1 may be interpreted as having a component perpendicular with respect to the free layer FL1. Thus, even if the angle between the protruding element PE1 and the free layer FL1 is not 90°, when the protruding element PE1 protrudes upward or downward from the free layer FL1, the protruding element PE1 may be interpreted as having a component perpendicular with respect to the free layer FL1. Therefore, the expression "direction perpendicular to the free layer FL1" used herein is to be interpreted in a broad sense. According to the current example embodiments, the protruding element PE1 may protrude downward from the free layer FL1 (i.e., perpendicularly from the free layer FL1) toward the pinned layer PL1 as shown in FIGS. 1A to 1C. The protruding element PE1 may have a structure that surrounds the pinned layer PL1. Magnetic properties of the protruding element PE1 may be the same as, or similar to, those of the free layer FL1. In other words, the protruding element PE1 may have a magnetization direction that is changeable, similar to the free layer FL1. Thus, the free layer FL1 and the protruding element PE1 may constitute a "free layer structure". The free layer structure may have a stereoscopic structure (i.e., a three-dimensional structure) including the free layer FL1 and the protruding element PE1 protruding from the free layer FL1 in a perpendicular direction. A material used to form the protruding element PE1 may, or may not, be the same as that of the free layer FL1. At least a portion of the protruding element PE1 may have a protrusion length of about 8 nm or greater (length in a Z-axis direction). However, if required, the length of the protruding element PE1 in the Z-axis direction may be less than about 8 nm.

Because the protruding element PE1 contacts the free layer FL1 (i.e., the protruding element PE1 extends from the free layer FL1), the magnetization direction of the free layer FL1 may not be easily changed by heat. In other words, thermal stability of the free layer FL1 may be improved by the protruding element PE1. In order to change the magnetization direction of the free layer FL1, the magnetization direction of the protruding element PE1 should be changed as well. Thus, in a structure where the free layer FL1 contacts the protruding element PE1, the magnetization direction of the free layer FL1 is not easily changed by heat. Particularly, if the protruding element PE1 has a closed fence structure, thermal stability of the free layer FL1 may further be improved. This will be described in more detail later.

If a Y-axis directional width of the magnetoresistive element of FIG. 1A is denoted by W1, and an X-axis directional width of the magnetoresistive element of FIG. 1A is denoted by W2, the Y-axis directional width W1 and the X-axis directional width W2 may be different from each other. For example, the Y-axis directional width W1 may be 1F, and the X-axis directional width W2 may be 2F. In this regard, F indicates a feature size. The ratio of the Y-axis directional width W1 to the X-axis directional width W2 of the magnetoresistive element may be 1:2 or similar thereto. However, the ratio of the Y-axis directional width W1 to the X-axis directional width W2 of the magnetoresistive element may be variously changed. Meanwhile, ratios of a Y-axis directional width to an X-axis directional width of the pinned layer PL1 and the separation layer SL1 may be similar to, or slightly different from, the ratio of the Y-axis directional width W1 to the X-axis directional width W2 of the magnetoresistive element. The ratios of a Y-axis directional width to an X-axis directional width of the pinned layer PL1 and the separation layer SL1 may be 1:2 or similar thereto.

Hereinafter, the pinned layer PL1, the free layer FL1, and the protruding element PE1 will be described in more detail.

The pinned layer PL1 and the free layer FL1 may have in-plane magnetic anisotropy. In this case, the protruding element PE1 may also have in-plane magnetic anisotropy. If the pinned layer PL1, the free layer FL1, and the protruding element PE1 have in-plane magnetic anisotropy, they may include a soft magnetic material. Magnetic anisotropic energy of the soft magnetic material may be in a range of about $10^4$ to about $10^5$ erg/cc. The soft magnetic material may be Ni, Co, NiCo, NiFe, CoFe, CoFeB, CoZrNb, CoZrCr, or the like. If the pinned layer PL1, the free layer FL1, and the protruding element PE1 have in-plane magnetic anisotropy, their magnetization easy axis may be determined by shape anisotropy. In this regard, the pinned layer PL1 and the free layer FL1 may have an elongated shape in a set direction, for example, in a direction along the X-axis. For example, the pinned layer PL1 and the free layer FL1 may have a rectangular shape with two long sides in a direction along the X-axis and two short sides in a direction along the Y-axis. In this case, the protruding element PE1 may have first portions p10 respectively corresponding to the two short sides of the free layer FL1 and second portions p20 respectively corresponding to the two long sides of the free layer FL1. The first portions p10 are portions protruding from both X-axis directional ends of the free layer FL1, and the second portions p20 are portions protruding from both Y-axis directional ends of the free layer FL1. The ⊗, ⊙, and arrows shown in the pinned layer PL1, the free layer FL1, and the protruding element PE1 of FIGS. 1B and 1C indicate the magnetization directions of the pinned layer PL1, the free layer FL1, and the protruding element PE1. In this regard, ⊗ indicates a magnetization direction in an X-axis direction, and ⊙ indicates a magnetization direction in a reverse X-axis direction. The magnetization direction of the pinned layer PL1 may be fixed, and the magnetization directions of the free layer FL1 and the protruding element PE1 may be inverted. For example, the magnetization direction of the pinned layer PL1 may be fixed in the reverse X-axis direction. The magnetization direction of the free layer FL1 may be inverted between the X-axis direction and the reverse X-axis direction.

In FIGS. 1B and 1C, the free layer FL1 is magnetized in the X-axis direction. The first portions p10 of the protruding element PE1 may have a magnetization direction parallel to the Z-axis (FIG. 1C). In this regard, the first portions p10 may have a long side in the Z-axis direction. That is, the Z-axis directional side of the first portions p10 may be longer than the Y-axis directional width W1. If the free layer FL1 is magnetized in the X-axis direction, a left-side first portion p10 of the free layer FL1 may be magnetized in the Z-axis direction, and a right-side first portion p10 of the free layer FL1 may be magnetized in a reverse Z-axis direction (FIG. 1C). The second portions p20 of the protruding elements PE1 may be magnetized in the same direction as the free layer FL1 (FIG. 1B). The directions indicated by ⊗, ⊙, and the arrows (i.e., the magnetization directions) shown in FIGS. 1B and 1C are exemplarily illustrated and may be changed.

In the protruding element PE1, an X-axis directional thickness of the first portions p10 may be, for example, about 5 nm or less, or about 3 nm or less. Similarly, a Y-axis directional thickness of the second portions p20 may be, for example, about 5 nm or less, or about 3 nm or less. The thicknesses of the first portions p10 and the second portions p20 may be similar to or less than a Z-axis directional thickness of the free layer FL1. The Z-axis directional thickness of the free layer FL1 may be about 5 nm or less. For example, the Z-axis directional thickness of the free layer FL1 may be in a range of about 0.5 nm to about 5 nm. However, the thicknesses are exemplarily described and may vary.

Meanwhile, the free layer FL1 and the protruding element PE1 are shown as separate elements using dashed lines in FIGS. 1B and 1C, but they may be integrated (i.e., the free layer FL1 and the protruding element PE1 may be formed as a single body). In addition, referring to FIGS. 1B and 1C, the protruding element PE1 extends from a side of the free layer FL1, but this structure is exemplarily illustrated. The protruding element PE1 may also extend from a lower surface (or upper surface) of an edge of the free layer FL1.

The magnetoresistive element according to the current example embodiments is described above with reference to FIGS. 1A to 1C. Hereinafter, FIGS. 1A to 1C may be referred to as FIG. 1.

Figure 2A:
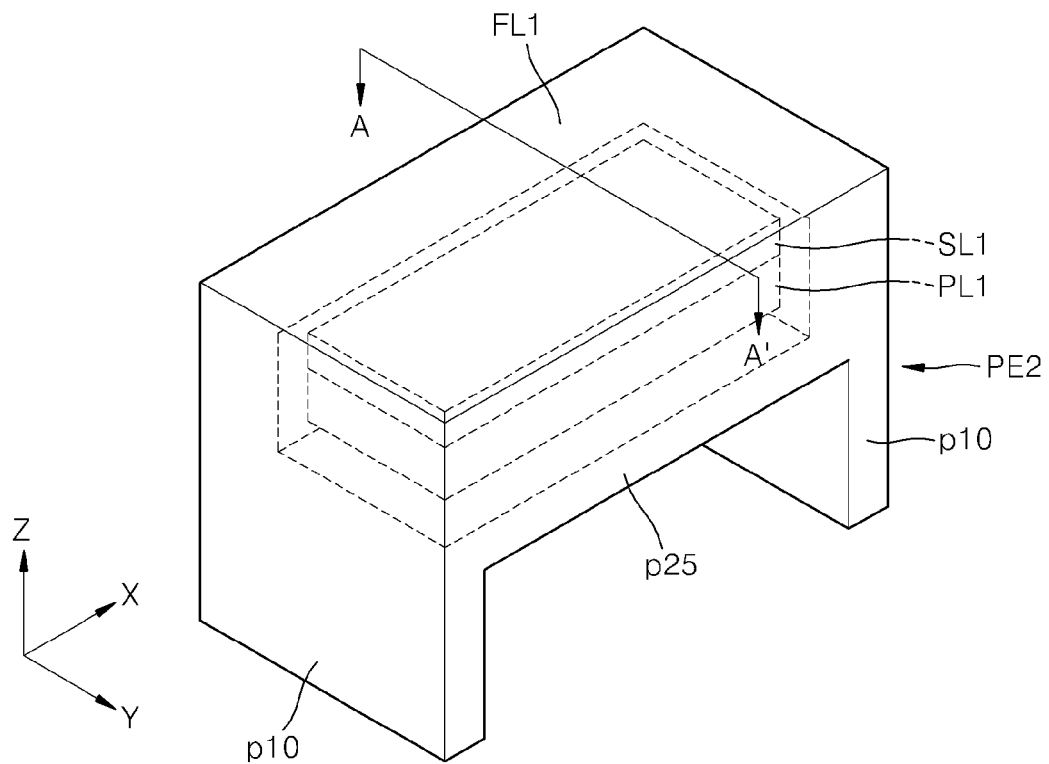
FIG. 2A is a perspective view of a magnetoresistive element according to other example embodiments.
Figure 2B:
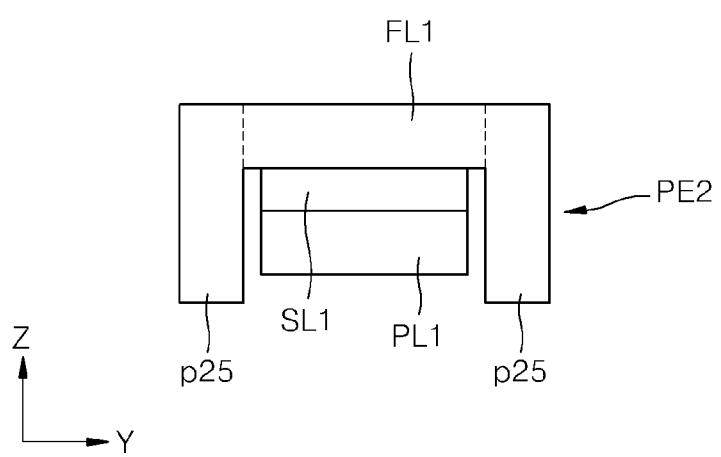
FIG. 2B is a cross-sectional view taken along a line A-A' of FIG. 2A.

The structure of the protruding element PE1 in FIG. 1 may be modified in various ways. For example, although Z-axis directional lengths of the first portions p10 and the second portions p20 are the same in FIG. 1, the lengths of the first portions p10 and the second portions p20 may be different from each other according to other example embodiments. An example thereof is illustrated in FIGS. 2A and 2B. FIG. 2B is a cross-sectional view taken along a line A-A' of FIG. 2A.

Referring to FIGS. 2A and 2B, a protruding element PE2 may include first portions p10 and second portions p25. The first portions p10 may be portions protruding from two short sides (i.e., both X-axis directional ends) of the free layer FL1, and the second portions p25 may be portions protruding from two long sides (i.e., both Y-axis directional ends) of the free layer FL1. A protrusion length of the second portions p25 may be shorter than a protrusion length of the first portions p10. In this case, thermal stability of the free layer FL1 may further be improved. This will be described in more detail later with reference to FIG. 22. Hereinafter, FIGS. 2A and 2B may be referred to as FIG. 2.

In the example embodiments described with reference to FIGS. 1 and 2, the magnetization direction of the pinned layer PL1 may be fixed by using various methods. For example, in order to fix the magnetization direction of the pinned layer PL1, a synthetic antiferromagnetic (SAF) structure (not shown) or an antiferromagnetic layer (not shown) may be used. The magnetization direction may also be fixed by using shape anisotropy of the pinned layer PL1 without using the SAF structure or the antiferromagnetic layer. That is, the magnetization direction of the pinned layer PL1 may be fixed without using an additional layer.

Figure 3:
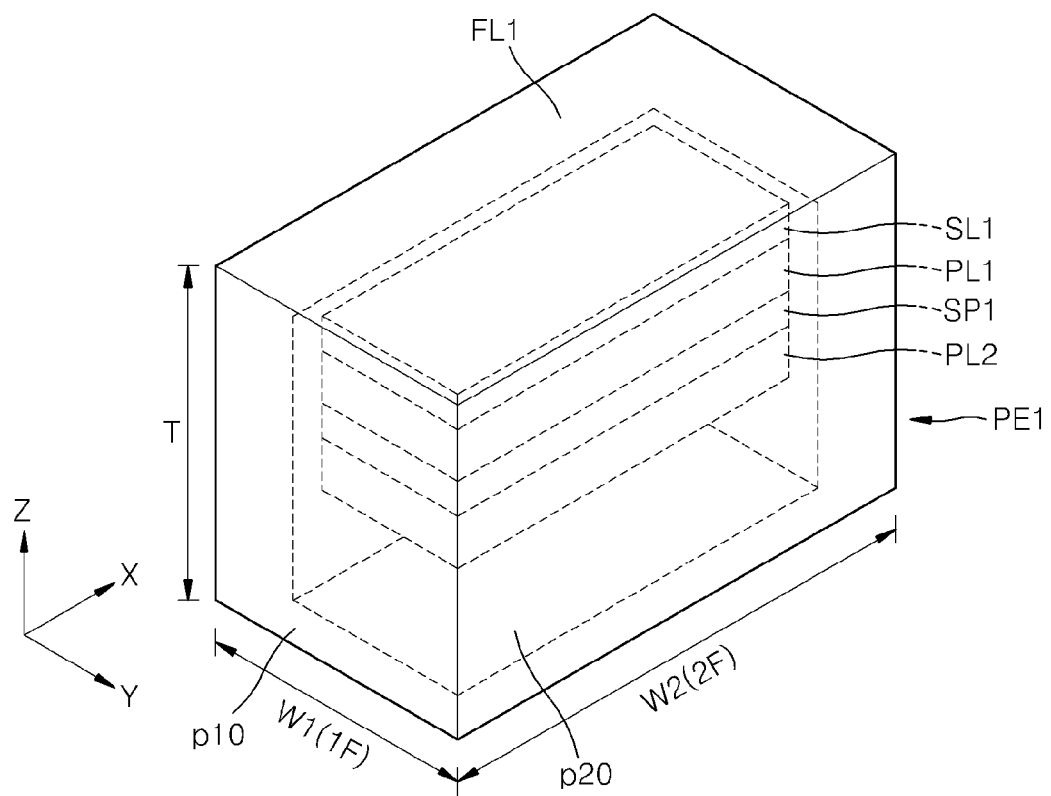
FIGS. 3 to 16 are perspective views of a magnetoresistive element according to yet further example embodiments.
Figure 4:
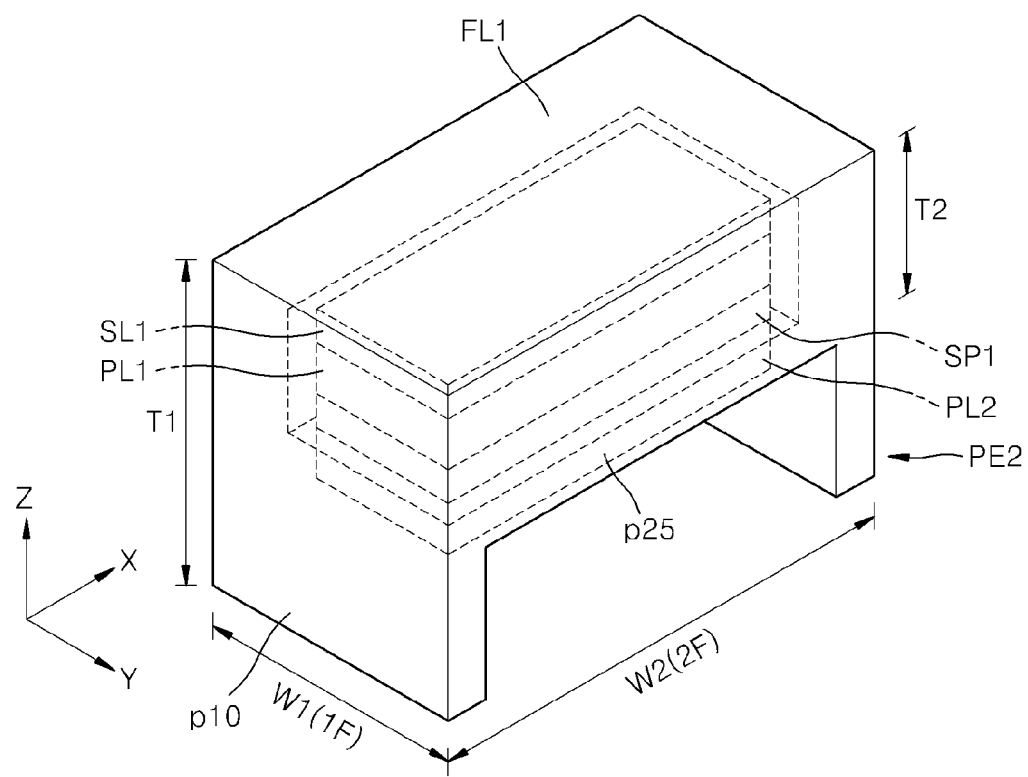

FIGS. 3 and 4 are perspective views modified from FIGS. 1 and 2 and illustrate the SAF structure used in order to fix the magnetization direction of the pinned layer PL1.

Referring to FIGS. 3 and 4, a second pinned layer PL2 corresponding to the pinned layer PL1 (hereinafter, referred to as a first pinned layer) may be further provided. The second pinned layer PL2 may be disposed under the first pinned layer PL1. Thus, the first pinned layer PL1 may be disposed between the second pinned layer PL2 and the free layer FL1.

A spacer SP1 may be disposed between the first pinned layer PL1 and the second pinned layer PL2. The second pinned layer PL2 may have a magnetization direction fixed in a direction opposite to the magnetization direction of the first pinned layer PL1. The first pinned layer PL1, the spacer SP1, and the second pinned layer PL2 collectively constitute the SAF structure. In this SAF structure, the first and second pinned layers PL1 and PL2, which are disposed adjacent to each other with the spacer SP1 therebetween, may have magnetization directions fixed opposite to each other. The second pinned layer PL2 and the first pinned layer PL1 may be formed of the same, or similar, materials. The spacer SP1 may include at least one conductive material (e.g., Ru, Cu, Al, Au, Ag, and any mixture thereof), and a thickness of the spacer SP1 may be less than about 5 nm, for example, about 3 nm or less. The structures of FIGS. 3 and 4 may be the same as those of FIGS. 1 and 2, except for the second pinned layer PL2 and the spacer SP1 further disposed, and thus descriptions thereof will not be provided here.

The direction of the protruding elements PE1 and PE2 of FIGS. 1 to 4 may be modified. In FIGS. 1 to 4, the protruding elements PE1 and PE2 protrude toward the pinned layer PL1 (i.e., downward from the free layer FL1). However, according to other example embodiments, the protruding elements PE1 and PE2 may protrude in a direction away from the pinned layer PL1 (i.e., upward). Examples thereof are shown in FIGS. 5 to 8.

FIGS. 5 to 8 are perspective views illustrating protrusion directions different from those of the protruding elements PE1 and PE2 shown in FIGS. 1 to 4.

Figure 5:
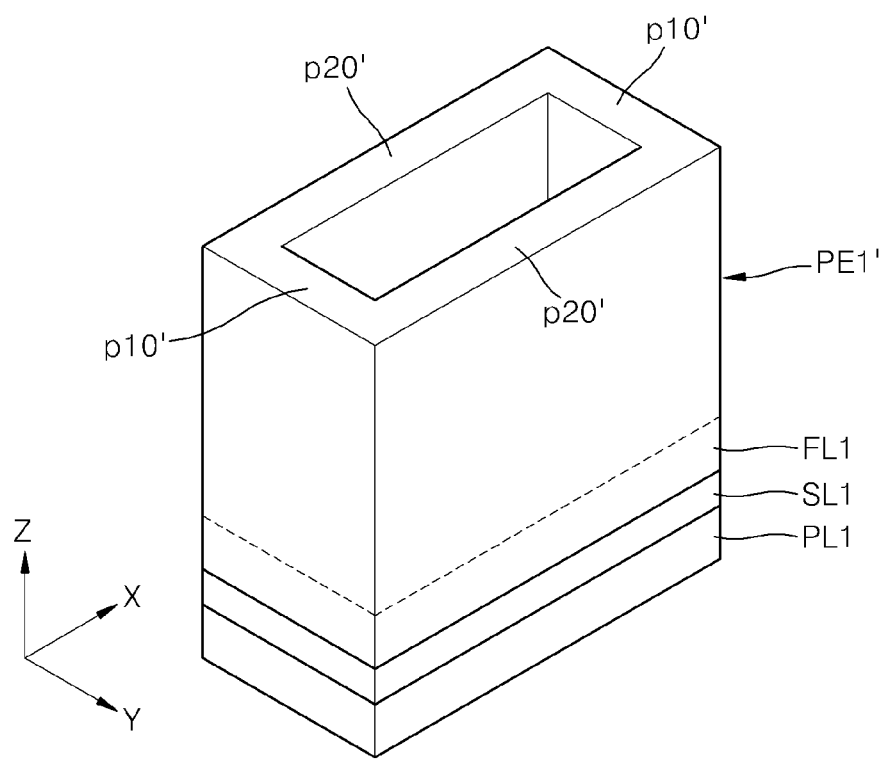
Figure 6:
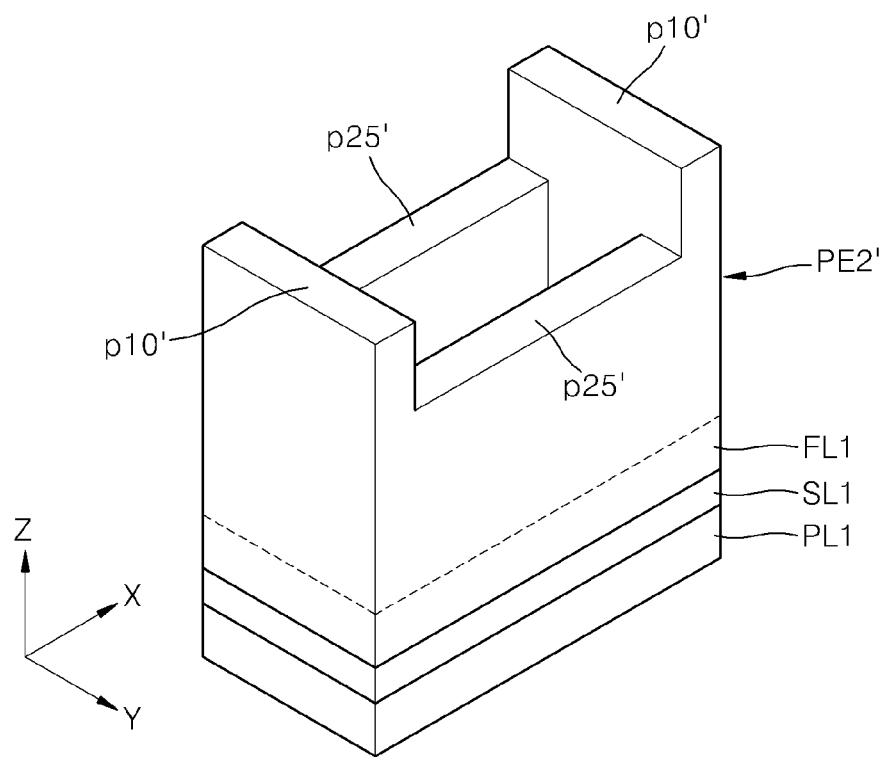
Figure 7:
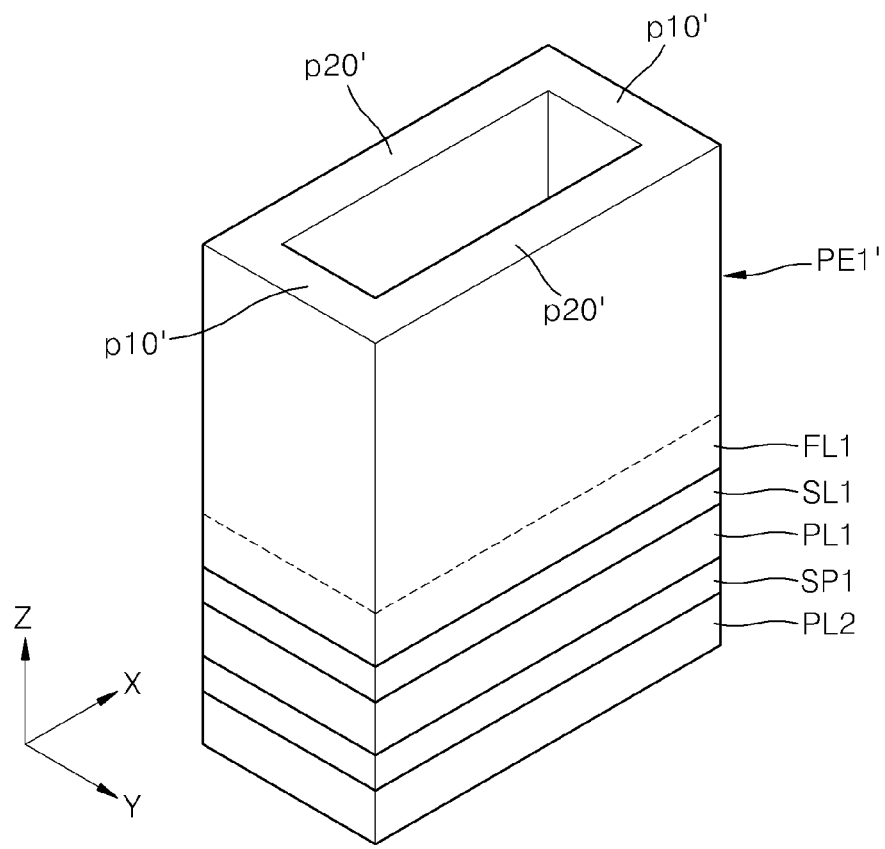

Referring to FIGS. 5 to 8, protruding elements PE1' and PE2' may protrude upward from the free layer FL1. That is, the protruding elements PE1' and PE2' may protrude in a direction away from the pinned layer PL1. In FIGS. 5 and 7, the protruding element PE1' may have first portions p10' protruding from short sides of the free layer FL1 and second portions p20' protruding from long sides of the free layer FL1. Protrusion lengths of the first portions p10' and the second portions p20' may be the same (e.g., have a same length and/or extend along the z-axis to a same y-axis plane).

Figure 8:
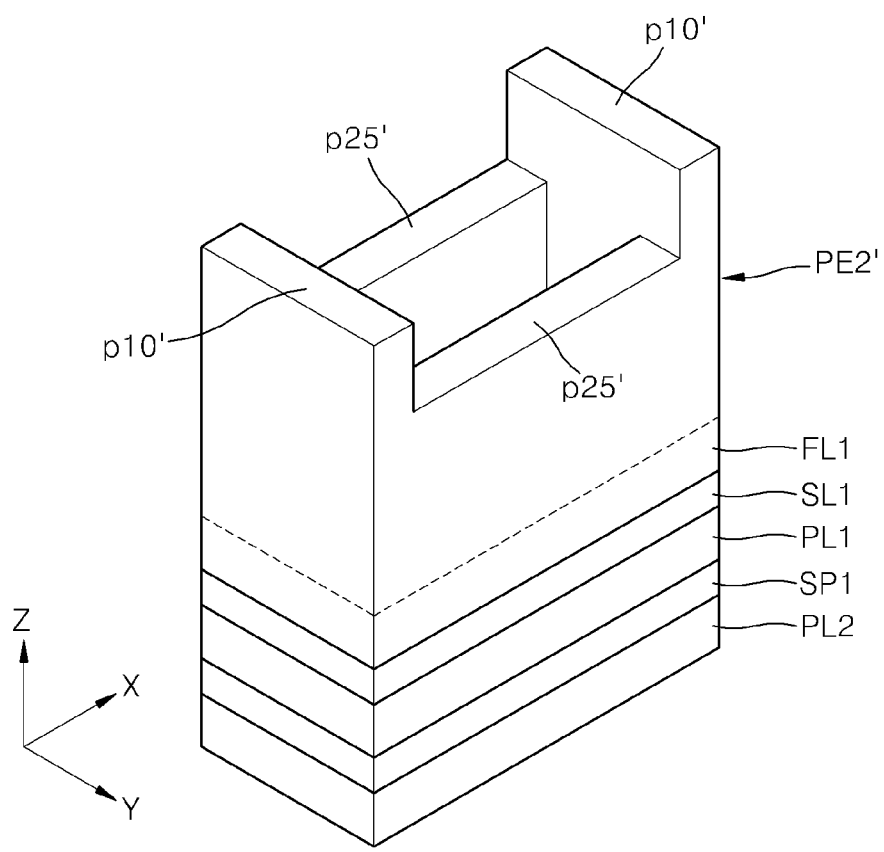
Figure 9:
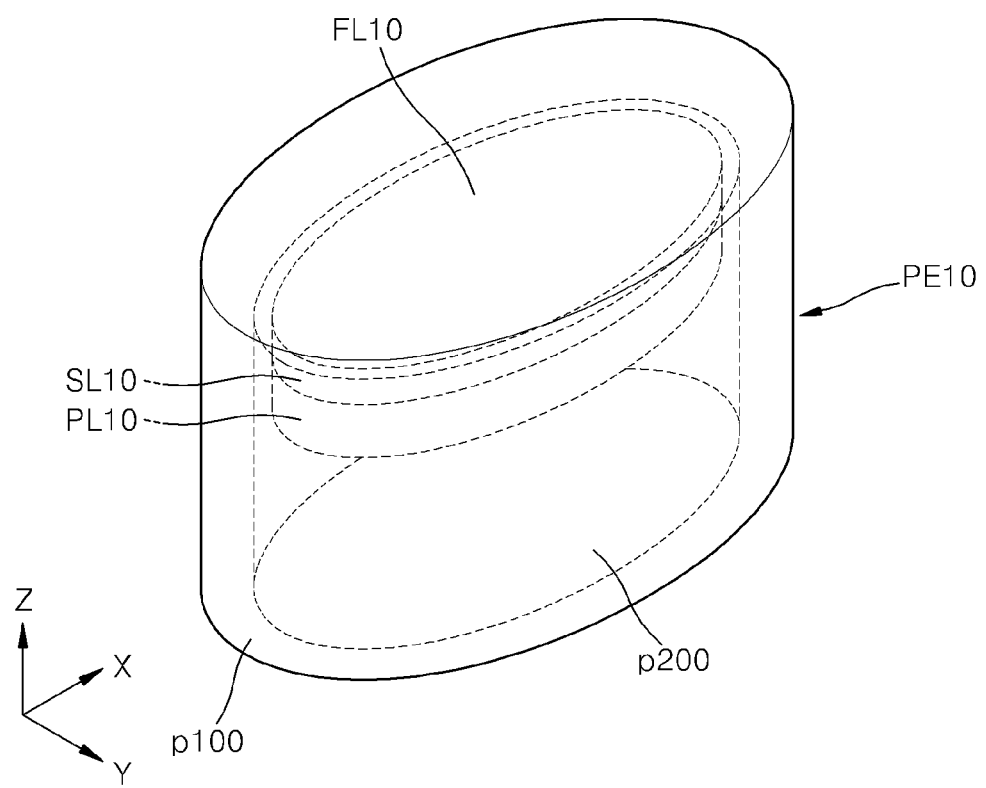
Figure 10:
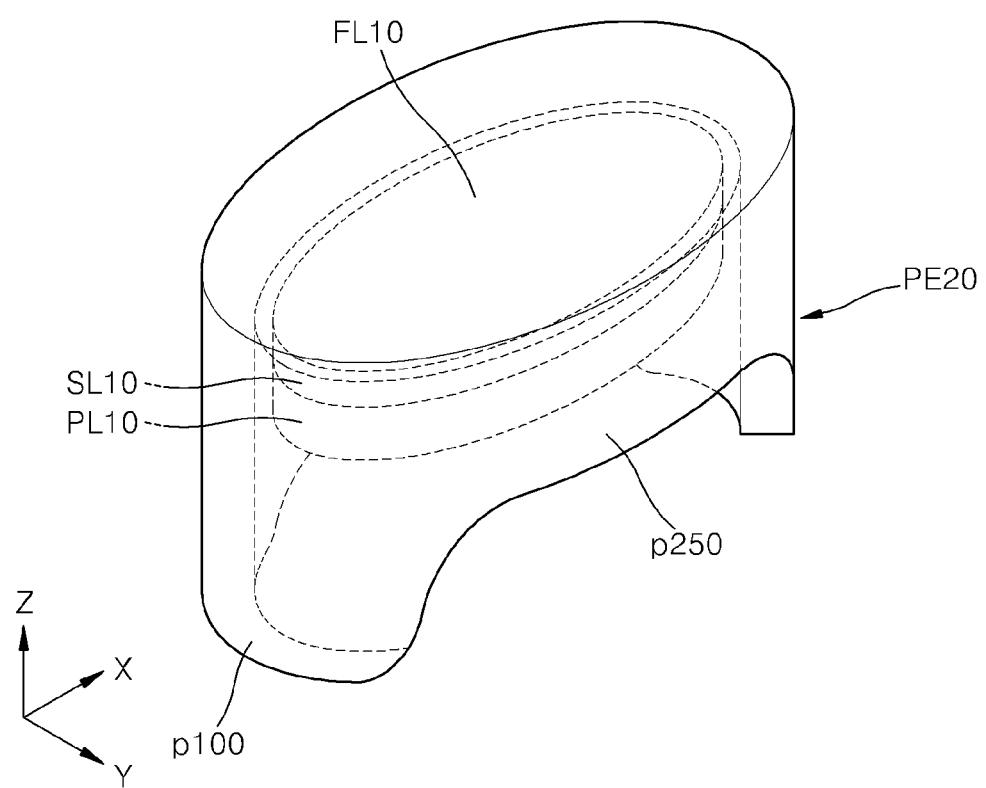
Figure 11:
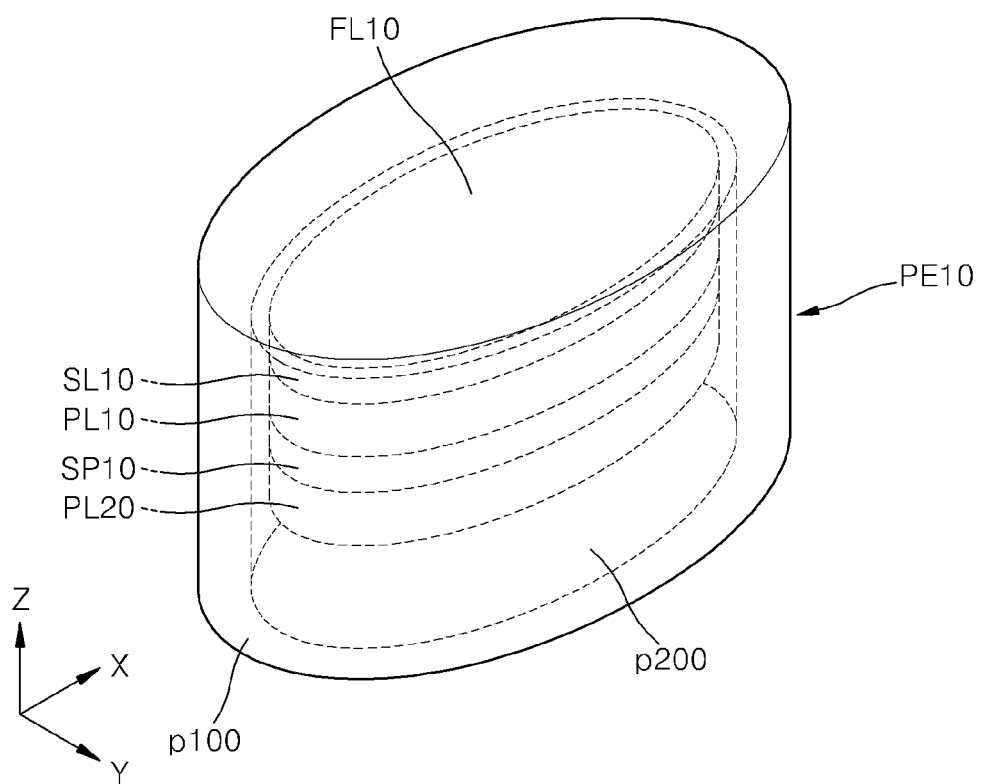
Figure 12:
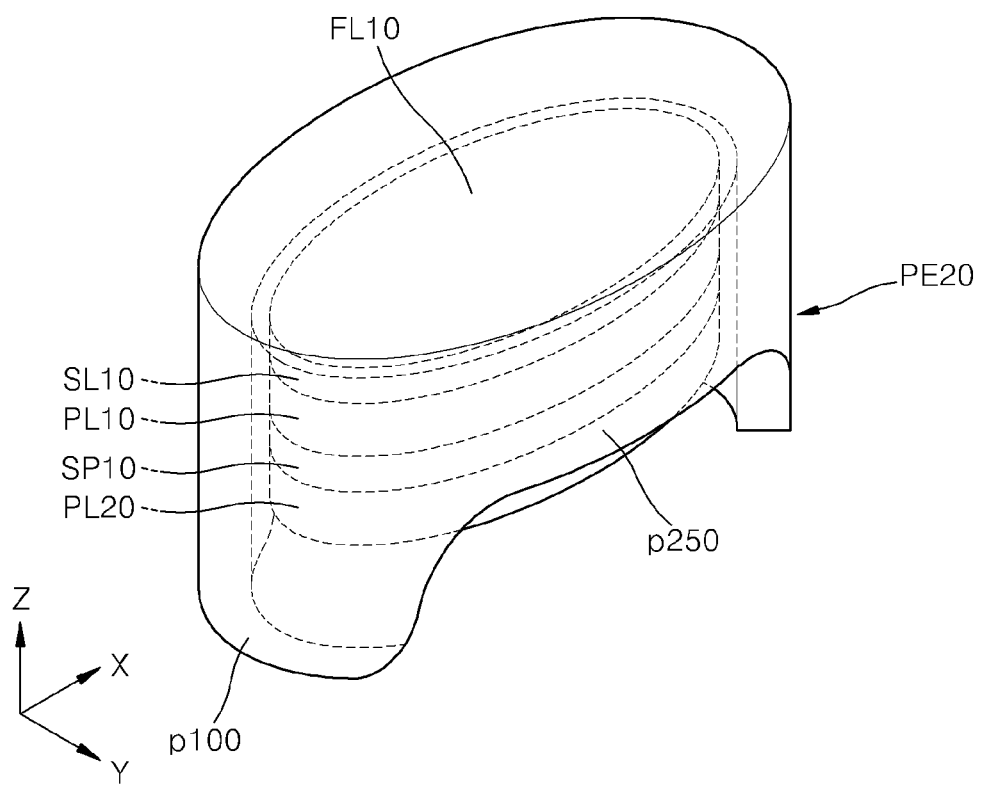
Figure 13:
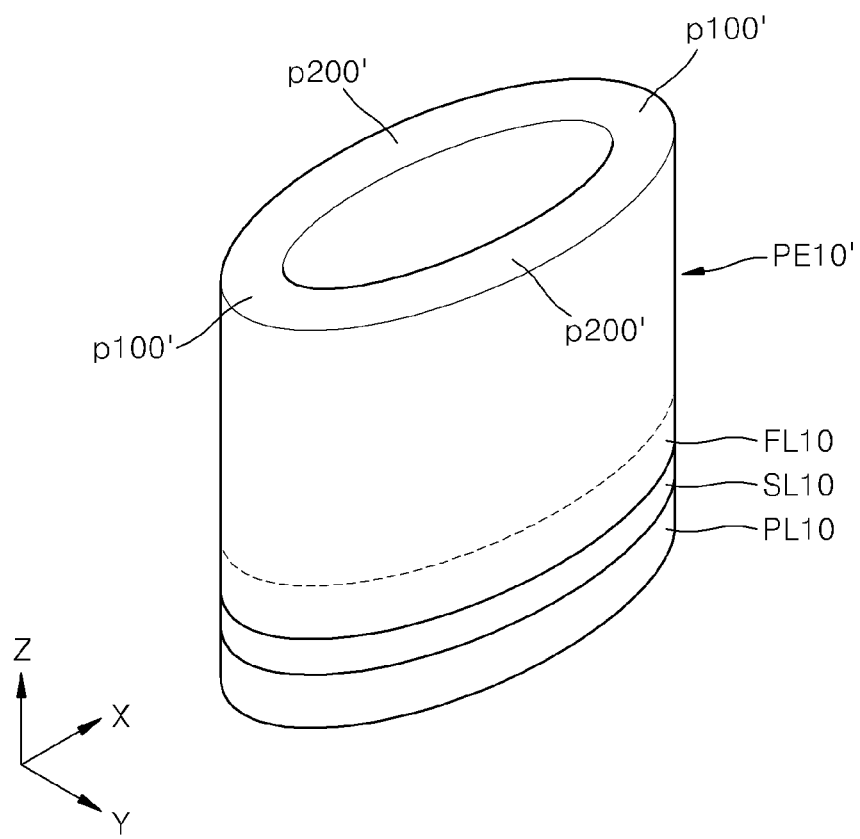
Figure 14:
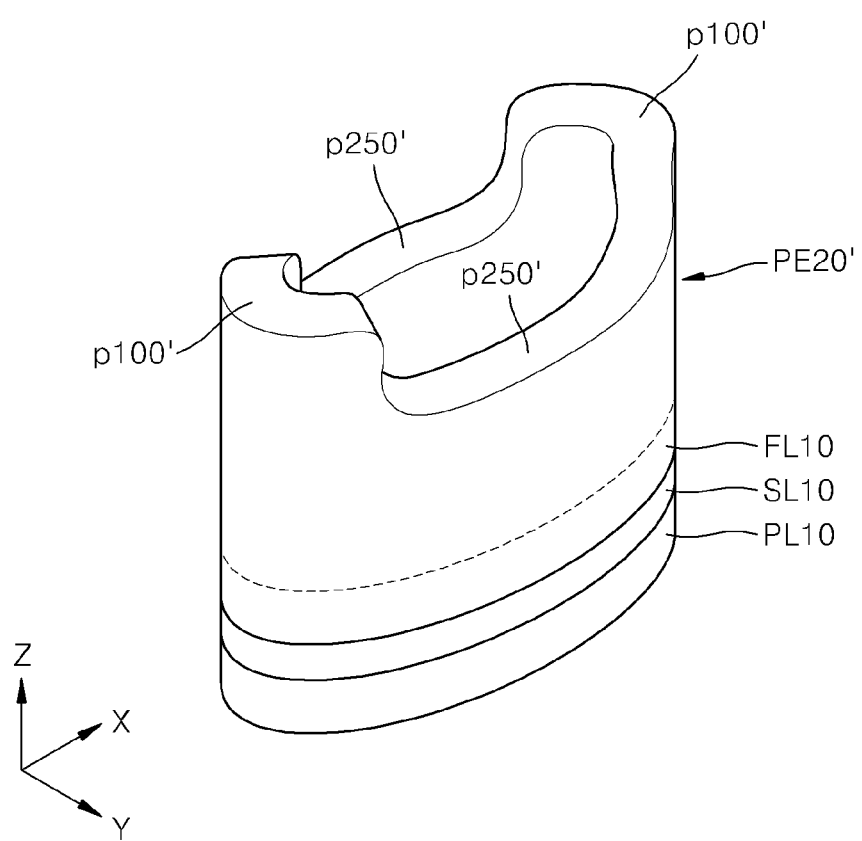
Figure 15:
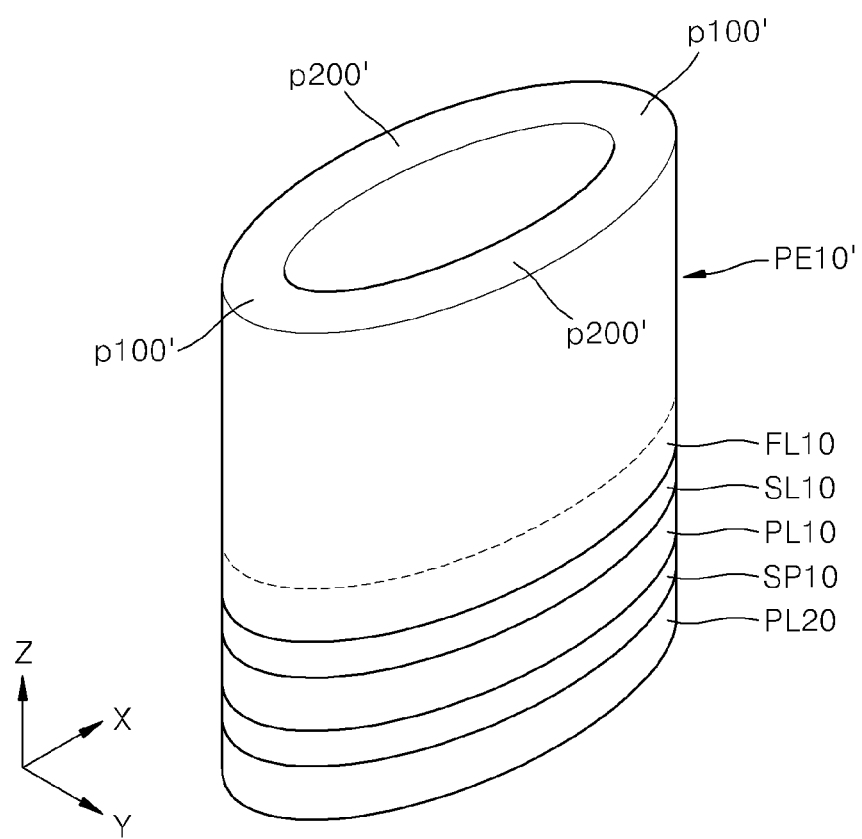
Figure 16:
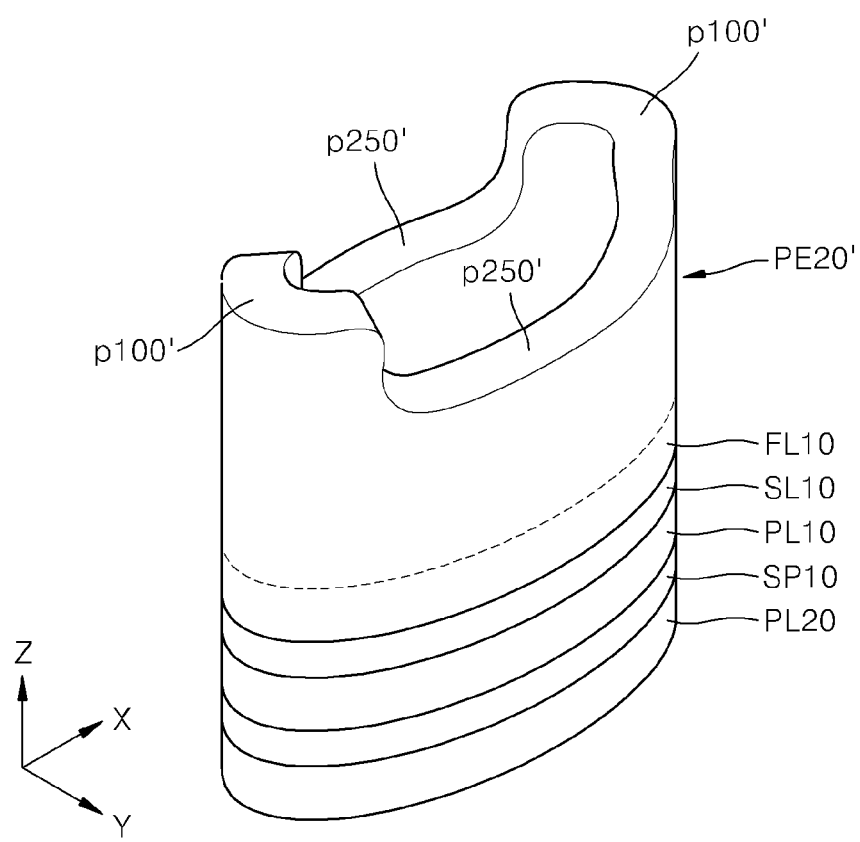

In FIGS. 6 and 8, the protruding element PE2' may have first portions p10' protruding from short sides of the free layer FL1 and second portions p25' protruding from long sides of the free layer FL1. Protrusion lengths of the first portions p10' and the second portions p25' may be different from each other. The protrusion length of the second portions p25' may be shorter than the protrusion length of the first portions p10'. The structures of FIGS. 5 to 8 may be the same as those of FIGS. 1 to 4, except for the modified position/direction of the protruding elements PE1' and PE2'.

In FIGS. 1 to 8, the pinned layers PL1 and PL2, the free layer FL1, and the protruding elements PE1, PE1', PE2, and PE2' have tetragonal (rectangular) shapes, but these shapes may be modified in various ways. For example, the pinned layers PL1 and PL2, the free layer FL1, and the protruding elements PE1, PE1', PE2, and PE2' may have an oval shape or a similar shape from a top view. Examples thereof are shown in FIGS. 9 to 16.

In FIGS. 9 to 16, reference numerals PL10, SL10, and FL10 respectively denote a pinned layer (first pinned layer), a separation layer, and a free layer, reference numerals PE10, PE10', PE20, and PE20' denote protruding elements, and reference numerals PL20 and SP10 respectively denote a second pinned layer and a spacer. Reference numerals p100 and p100' denote first portions of the protruding elements PE10, PE10', PE20, and PE20', and reference numerals p200, p200', p250, and p250' denote second portions of the protruding elements PE10, PE10', PE20, and PE20'. The first portions p100 and p100' are portions protruding from both long axis directional ends of the free layer FL10, and the second portions p200, p200', p250, and p250' are portions protruding from both short axis directional ends of the free layer FL10. The structures of FIGS. 9 to 16 are the same as those of FIGS. 1 to 8, except for the rounded shape of each layer, and functions of each layer of the structures of FIGS. 9 to 16 are similar to those described above. Thus, thermal stability of the free layer FL10 may be improved by the protruding elements PE10, PE10', PE20, and PE20' in the structures illustrated in FIGS. 9 to 16.

Figure 17A:
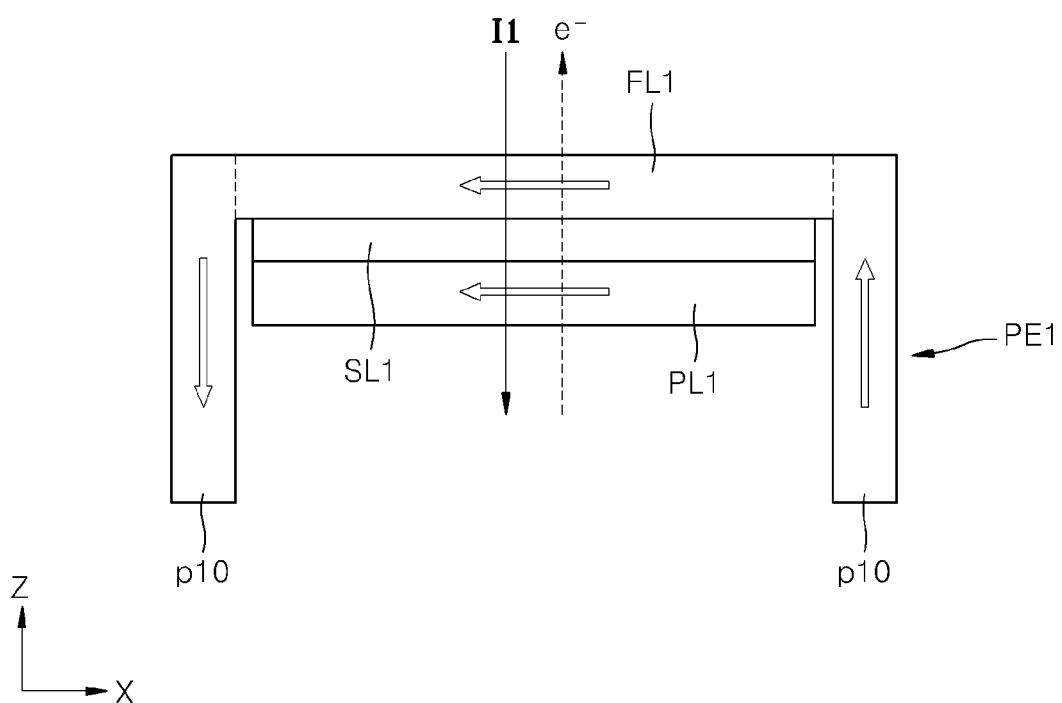
FIGS. 17A and 17B are cross-sectional views for describing a method of operating a magnetoresistive element according to example embodiments.
Figure 17B:
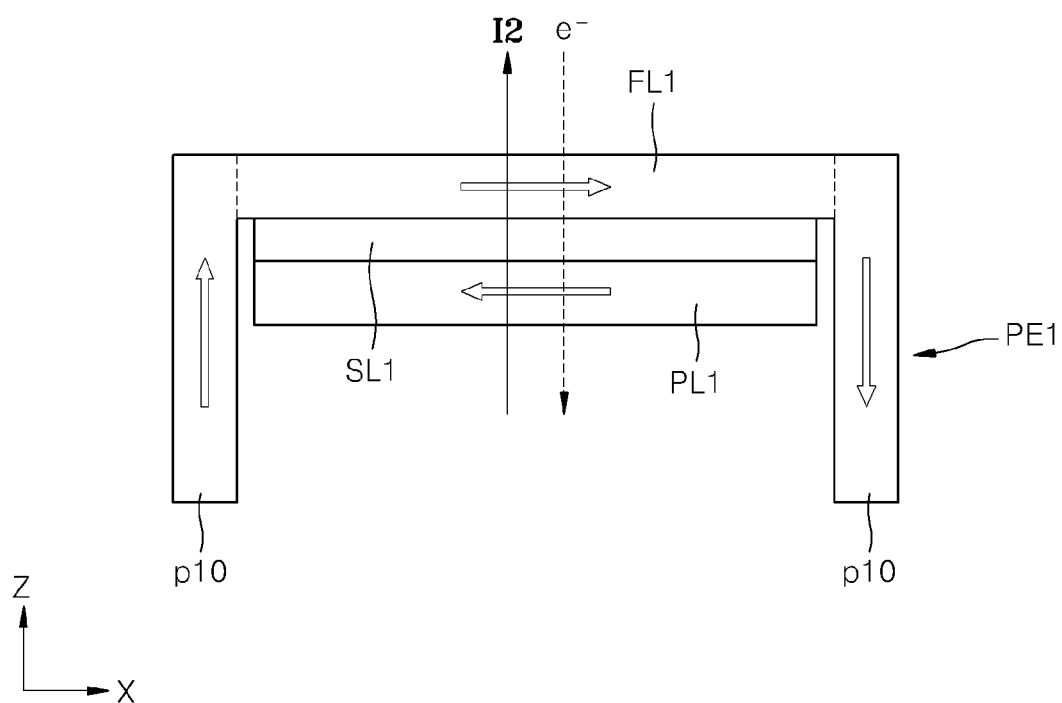

FIGS. 17A and 17B are cross-sectional views for describing a method of operating a magnetoresistive element according to example embodiments.

The operating method described with respect to FIGS. 17A and 17B is described with respect to the magnetoresistive element having the structure shown in FIGS. 1A to 1C, and the operating method of FIGS. 17A and 17B is shown with respect to FIG. 1C.

Referring to FIG. 17A, a first current I1 may be supplied from the free layer FL1 to the pinned layer PL1. The first current I1 may flow from the free layer FL1 to the pinned layer PL1 via the separation layer SL1. By the first current I1, electrons e– may flow from the pinned layer PL1 to the free layer FL1. The electrons e– flowing from the pinned layer PL1 to the free layer FL1 may have the same spin direction as the pinned layer PL1 and may apply a spin torque to the free layer FL1. Accordingly, the free layer FL1 may be magnetized in the same direction as the pinned layer PL1. As such, a state in which the free layer FL1 and the pinned layer PL1 are magnetized in the same direction is a parallel state, and the magnetoresistive element may have low resistance (first resistance). In this case, one of the two first portions p10 of the protruding element PE1 disposed at the left side of the free layer FL1 may be magnetized in the reverse Z-axis direction, and the other first portion p10 disposed at the right side of the free layer FL1 may be magnetized in the Z-axis direction. Meanwhile, although not shown in FIG. 17A, the second portions p20 of the protruding element PE1 may be magnetized in the same direction (i.e., the reverse X-axis direction) as the free layer FL1.

Referring to FIG. 17B, a second current I2 may be supplied from the pinned layer PL1 to the free layer FL1. The second current I2 may flow from the pinned layer PL1 to the free layer FL1 via the separation layer SL1. By the second current I2, electrons e– may flow from the free layer FL1 to the pinned layer PL1. By the electrons e– flowing from the free layer FL1 to the pinned layer PL1, the free layer FL1 may be magnetized in a direction opposite to that of the pinned layer FL1. This is because electrons having the same spin as the pinned layer PL1 among the electrons e– flowing to the pinned layer PL1 flow out through the pinned layer PL1, electrons having the spin opposite to that of the pinned layer PL1 return to the free layer FL1 and apply spin torque thereto. That is, because electrons having the spin opposite to that of the pinned layer PL1 apply spin torque to the free layer FL1, the free layer FL1 may be magnetized in the direction opposite to that of the pinned layer PL1. A state in which the free layer FL1 and the pinned layer PL1 are magnetized in opposite directions is an anti-parallel state, and the magnetoresistive element may have high resistance (second resistance). By the second current I2, the magnetization direction of the protruding element PE1 may be inverted. That is, as the magnetization direction of the free layer FL1 is inverted, the magnetization direction of the protruding element PE1 may also be inverted. Accordingly, one of the two first portions p10 of the protruding element PE1 disposed at the left side of the free layer FL1 may be magnetized in the Z-axis direction, and the other first portion p10 disposed at the right side of the free layer FL1 may be magnetized in the reverse Z-axis direction. Meanwhile, although not shown in FIG. 17B, the second portions p20 of the protruding element PE1 may be magnetized in the same direction (i.e., the X-axis direction) as the free layer FL1.

As described above with reference to FIGS. 17A and 17B, the magnetization direction of the free layer FL1 may be determined by the currents I1 and I2. As the spin torque of the electrons is applied to the free layer FL1 by the currents I1 and I2, the free layer FL1 may be magnetized in a set direction (i.e., the same direction as, or the direction opposite to) the magnetization direction of the pinned layer PL1. Thus, the magnetization of the free layer FL1 may be performed by spin transfer torque.

The pinned layer PL1, the free layer FL1, and the protruding element PE1 having in-plane magnetic anisotropy are described above. However, they may have perpendicular magnetic anisotropy. If the pinned layer PL1, the free layer FL1, and the protruding element PE1 have perpendicular magnetic anisotropy, they may include a hard magnetic material. Magnetic anisotropic energy of the hard magnetic material may be in a range of about $10^6$ to about $10^7$ erg/cc. The pinned layer PL1, the free layer FL1, and the protruding element PE1 including the hard magnetic material may have a magnetization easy axis perpendicular to a substrate due to relatively high magnetic anisotropy. Particularly, if the pinned layer PL1, the free layer FL1, and the protruding element PE1 have perpendicular magnetic anisotropy, they may have a multi-layered structure including a first layer including at least one of Co and a Co alloy and a second layer including at least one of Pt, Ni, and Pd alternately stacked, a FePt layer or CoPt layer having a $L1_0$ structure, or an alloy layer of a rare-earth element and a transition metal. The rare-earth element may include at least one of Tb and Gd, and the transition metal may include at least one of Ni, Fe, and Co.

Figure 18:
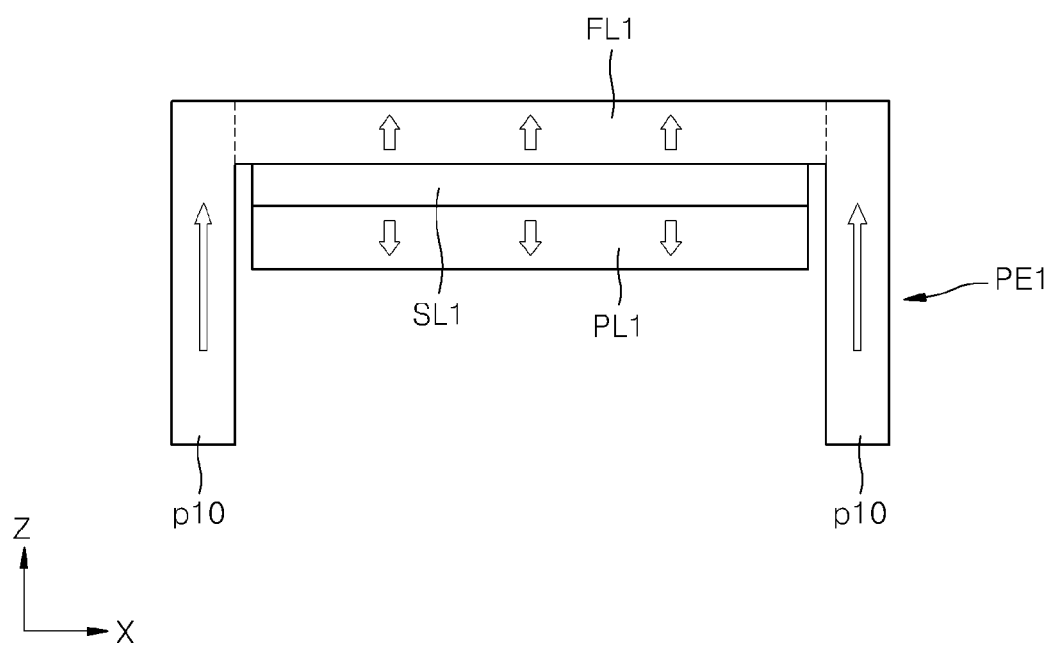
FIG. 18 is a cross-sectional view of a magnetoresistive element according to yet other example embodiments.

FIG. 18 is a cross-sectional view of a magnetoresistive element according to other example embodiments wherein the pinned layer, the free layer, and the protruding element have perpendicular magnetic anisotropy.

As shown in FIG. 18, the magnetization direction of the pinned layer PL1 may be fixed in a direction parallel to the Z-axis, for example, the reverse Z-axis direction. The magnetization direction of the free layer FL1 may be switched between the Z-axis direction and the reverse Z-axis direction.

In FIG. 18, the free layer FL1 is magnetized in the Z-axis direction. The protruding element PE1 may be magnetized in the same direction as the free layer FL1. Two first portions p10 of the protruding element PE1 may be magnetized in the same direction as the free layer FL1. Although not shown in FIG. 18, the second portions p20 of the protruding element PE1 may be magnetized in the same direction as the free layer FL1. As such, if the pinned layer PL1, the free layer FL1, and the protruding element PE1 have perpendicular magnetic anisotropy, and their magnetization directions are not determined by shape anisotropy. Thus, the shapes (width and length ratio) of the pinned layer PL1, the free layer FL1, and the protruding element PE1 may be easily modified. In addition, even if the pinned layer PL1, the free layer FL1, and the protruding element PE1 have perpendicular magnetic anisotropy, thermal stability of the free layer FL1 may be improved by the protruding element PE1.

Figure 19:
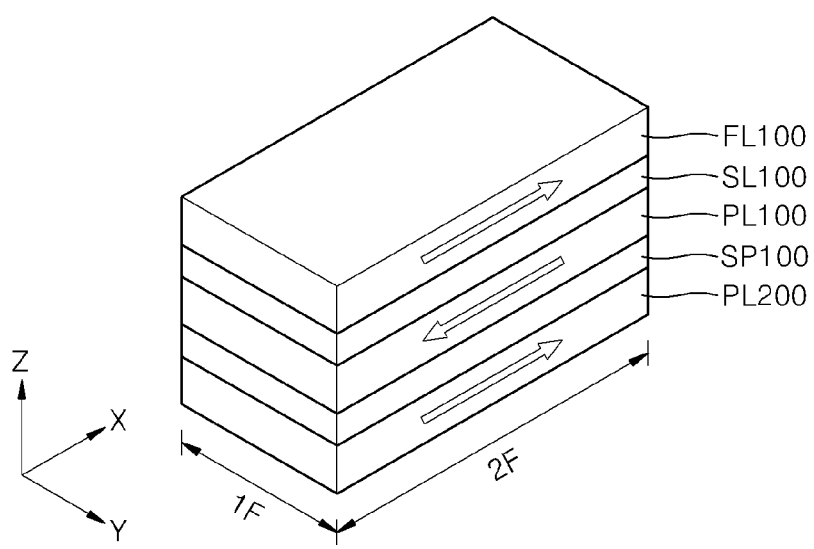
FIG. 19 is a perspective view of a magnetoresistive element according to a comparative example.

FIG. 19 is a perspective view of a magnetoresistive element according to a comparative example.

Referring to FIG. 19, the magnetoresistive element according to the comparative example has a structure including a separation layer SL100 and a free layer FL100 sequentially formed on a first pinned layer PL100, and a spacer SP100 and a second pinned layer PL200 sequentially formed under the first pinned layer PL100. The first pinned layer PL100 may be a CoFeB layer, the separation layer SL100 may be an MgO layer, and the free layer FL10 may be a CoFeB layer. The spacer SP100 may be a Ru layer, and the second pinned layer PL200 may be a CoFe layer. An X-axis directional width of the magnetoresistive element is 2F, and a Y-axis directional width thereof is 1F. In this regard, F indicates a feature size.

Figure 20:
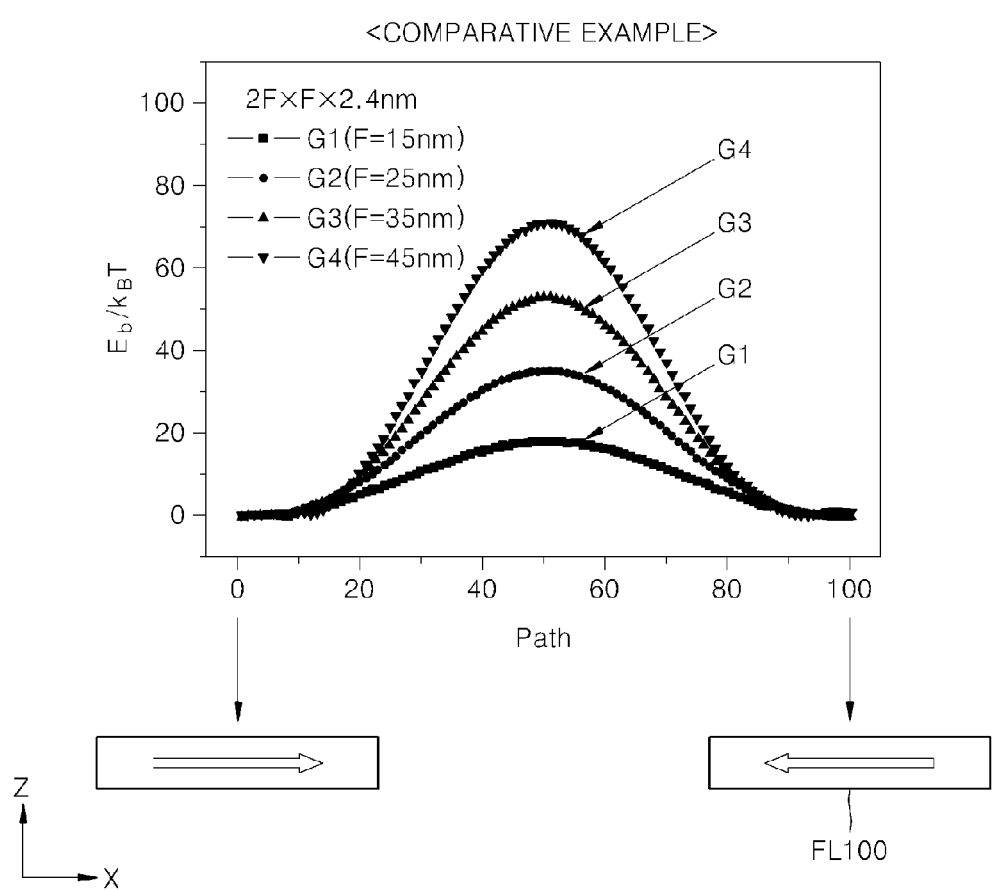
FIG. 20 is a graph showing $Eb/k_BT$ (energy barrier with respect to thermal energy) according to a switching path of a free layer while varying a feature size F in the structure of FIG. 19.

FIG. 20 is a graph showing $Eb/k_BT$ (energy barrier with respect to thermal energy) according to a switching path of the free layer while varying a feature size F in the structure of FIG. 19.

In this regard, Eb is energy barrier, $k_B$ is the Boltzmann constant, and T is absolute temperature. Here, the thickness of the free layer FL100 is 2.4 nm. In FIG. 20, in first to fourth plots G1, G2, G3, and G4, feature sizes F are 15 nm, 25 nm, 35 nm, and 45 nm, respectively.

In FIG. 20, when the path is 0, the free layer FL100 is magnetized in the X-axis direction, and when the path is 100, the free layer FL100 is magnetized in the reverse X-axis direction. A barrier (i.e., $Eb/k_BT$) between the path '0' and the path '100' is an energy barrier for inverting the magnetization direction of the free layer FL100. A relatively high barrier indicates excellent thermal stability of the free layer FL100. As the feature size F increases, $Eb/k_BT$ of the free layer FL100 increases. If the feature sizes F are 15 nm, 25 nm, and 35 nm (i.e., G1, G2, and G3), $Eb/k_BT$ of the center of the switching path is less than 60. If the feature size F is 45 nm (i.e., G4), $Eb/k_BT$ of the center of the switching path is greater than 60. If the $Eb/k_BT$ is about 60, thermal stability of the magnetoresistive element may be ensured for about 10 years. Accordingly, in order to maintain thermal stability of the magnetoresistive element according to the comparative example for longer than 10 years, the feature size F should be about 45 nm or greater. This means that it is difficult to reduce the feature size F of the magnetoresistive element according to the comparative example to less than 45 nm.

Figure 21:
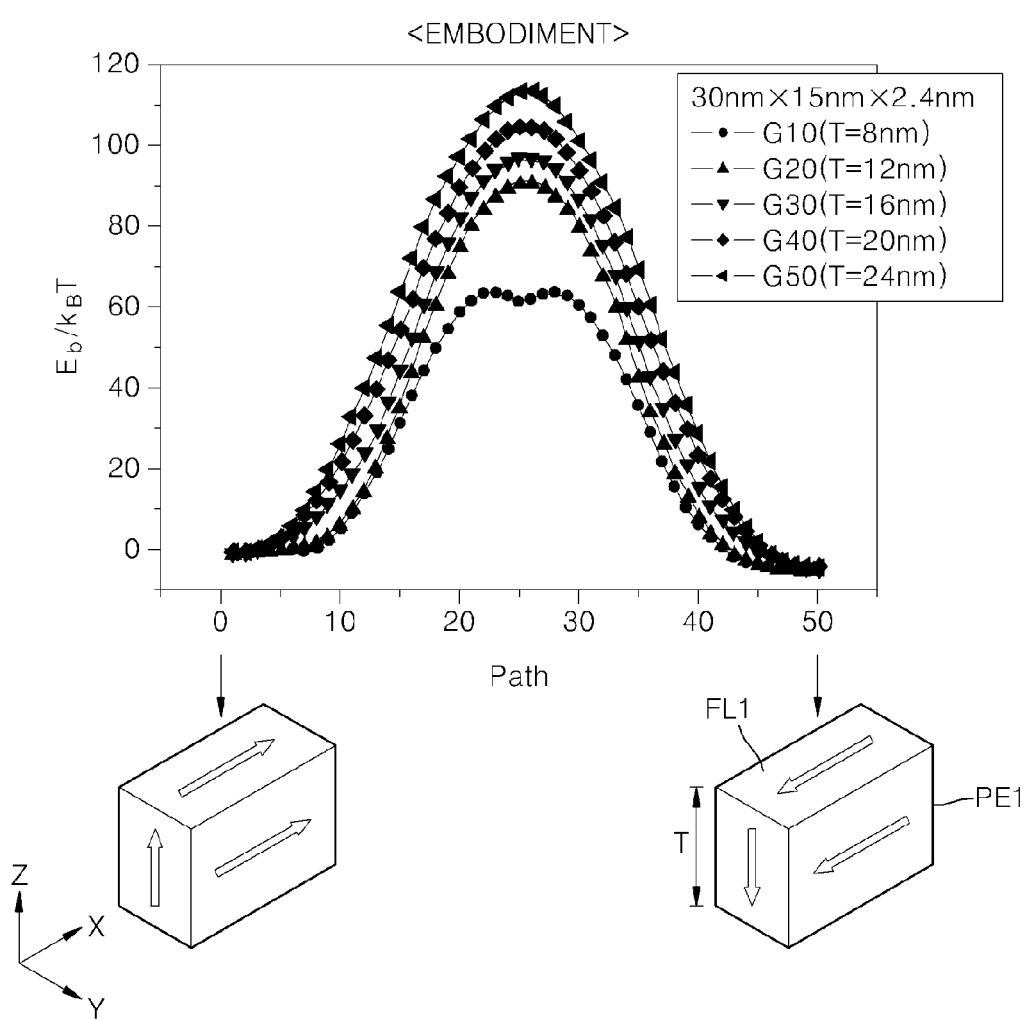
FIG. 21 is a graph showing $Eb/k_BT$ (energy barrier with respect to thermal energy) according to a switching path of a free layer when a feature size F of a magnetoresistive element of example embodiments is 15 nm.

FIG. 21 is a graph showing $Eb/k_BT$ (energy barrier with respect to thermal energy) according to a switching path of the free layer when a feature size F of the magnetoresistive element of FIG. 3 is 15 nm.

FIG. 21 illustrates results of the magnetoresistive element of FIG. 3. $Eb/k_BT$ of the free layer FL1 was measured while increasing the Z-axis directional length (i.e., protrusion length T) of the protruding element PE1 from 8 nm to 24 nm at increments of 4 nm. In this regard, the free layer FL1, the separation layer SL1, the first pinned layer PL1, the spacer SP1, and the second pinned layer PL2 are respectively formed of CoFeB, MgO, CoFeB, Ru and Co Fe. Thicknesses of the free layer FL1, the separation layer SL1, the first pinned layer PL1, the spacer SP1, and the second pinned layer PL2 are 2.4 nm, 1.6 nm, 2.4 nm, 0.8 nm, and 2.4 nm, respectively. The protruding element PE1 is formed of the same material as the free layer FL1. In first to fifth plots G10, G20, G30, G40, and G50 of FIG. 21, lengths T of the protruding element PE1 are 8 nm, 12 nm, 16 nm, 20 nm, and 24 nm, respectively.

Referring to FIG. 21, when the length T of the protruding element PE1 is 8 nm (i.e., G10), $Eb/k_BT$ of the center of the switching path is about 60 or greater. In addition, as the length T of the protruding element PE1 increases, $Eb/k_BT$ increases. When the length T of the protruding element PE1 was 24 nm (i.e., G50), $Eb/k_BT$ is greater than about 110. This result shows that even when the feature size F of the magnetoresistive element according to the current example embodiments is about 15 nm, excellent thermal stability may be obtained. Particularly, if the length T of the protruding element PE1 is longer than 8 nm, thermal stability may be considerably improved. If the length T of the protruding element PE1 is longer than 12 nm, excellent thermal stability may be obtained even when the feature size F of the magnetoresistive element is reduced to about 10 nm. Therefore, according to the current example embodiments, even though the feature size F is decreased to about 15 nm or less, the magnetoresistive element may have excellent thermal stability. In this regard, the magnetoresistive element according to the current example embodiments is suitable for scaling down and/or ensuring high performances of devices (for example, memory devices).

Figure 22:
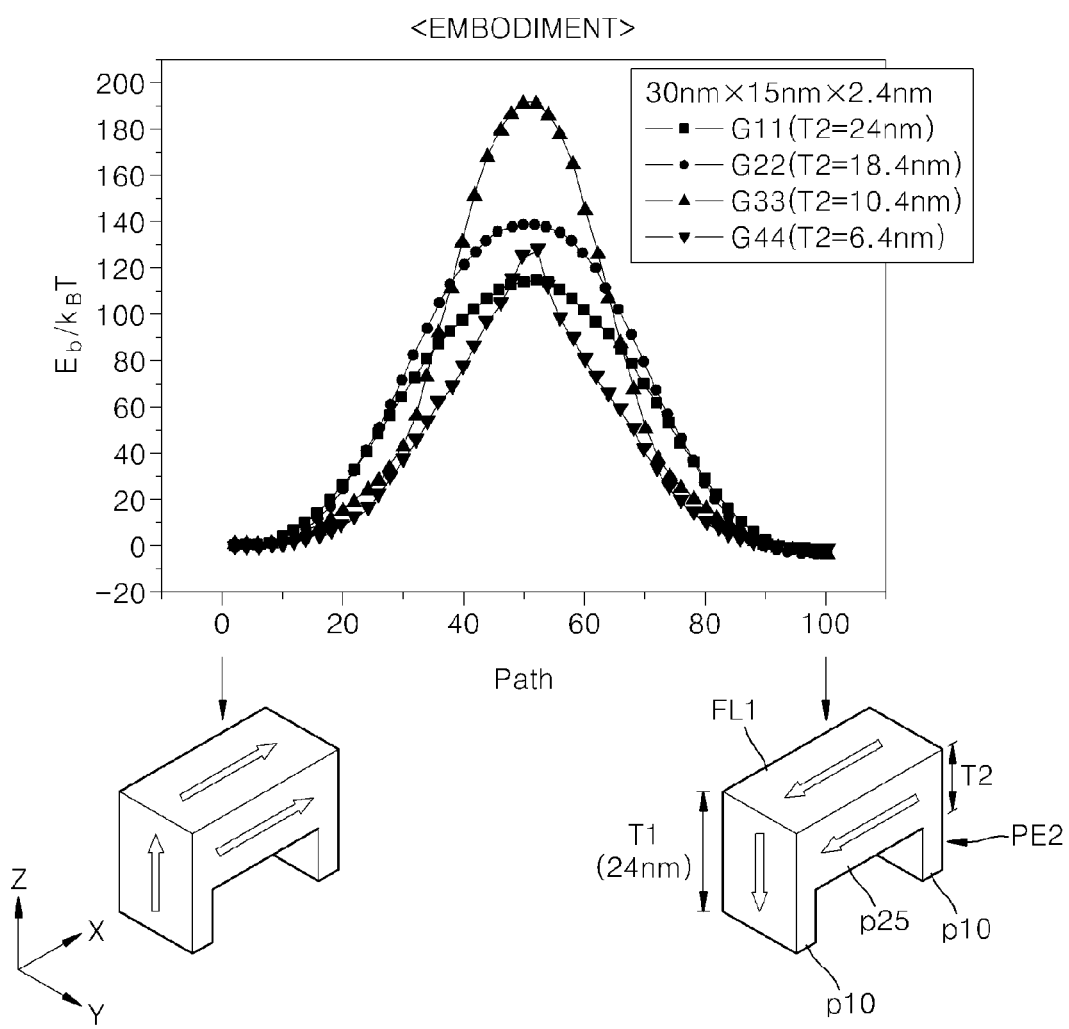
FIG. 22 is a graph showing $Eb/k_BT$ (energy barrier with respect to thermal energy) according to a switching path of a free layer when a feature size F of a magnetoresistive element of other example embodiments is 15 nm.

FIG. 22 is a graph showing $Eb/k_BT$ (energy barrier with respect to thermal energy) according to a switching path of the free layer when a feature size F of a magnetoresistive element of other example embodiments (FIG. 4) is 15 nm.

FIG. 22 illustrates results of the magnetoresistive element of FIG. 4. $Eb/k_BT$ of the free layer FL1 was measured while fixing the Z-axis directional length (i.e., protrusion length) T1 of the first portions p10 of the protruding element PE2 at 24 nm, and changing the Z-axis directional length (i.e., protrusion length) T2 of the second portions p25 of the protruding element PE2 to 24 nm, 18.4 nm, 10.4 nm, and 6.4 nm. In this regard, materials for and thicknesses of the free layer FL1, the separation layer SL1, the first pinned layer PL1, the spacer SP1, and the second pinned layer PL2 are the same as those described above with reference to FIG. 21. The protruding element PE2 is formed of the same material as the free layer FL1. In first to fourth plots G11, G22, G33, and G44 of FIG. 22, the lengths T2 of the second portions p25 of the protruding element PE2 are 24 nm, 18.4 nm, 10.4 nm, and 6.4 nm, respectively.

Referring to FIG. 22, when T2 is 24 nm (i.e., if T2 is the same as T1) (i.e., G11), $Eb/k_BT$ of the free layer FL1 is about 110. When T2 is 18.4 nm (i.e., G22), $Eb/k_BT$ is about 140, and if T2 is 10.4 nm (i.e., G33), $Eb/k_BT$ is about 190. That is, if T2 is less than T1, $Eb/k_BT$ may be considerably increased. Based on the results, when T2 is shorter than T1, thermal stability of the free layer FL1 is further improved, compared to when T1 and T2 are identical. Thus, as shown in FIG. 4, if the length T2 of the second portions p25 of the protruding element PE2 is shorter than the length T1 of the first portions p10, thermal stability may further be improved.

Figure 23:
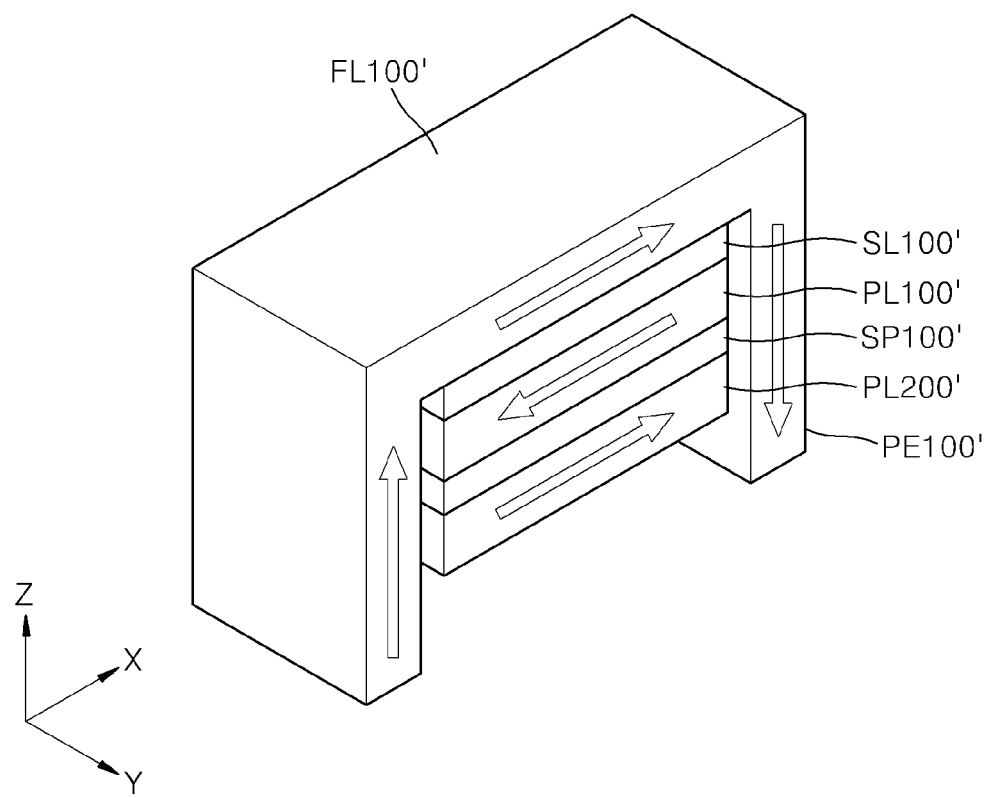
FIG. 23 is a perspective view of a magnetoresistive element according to another comparative example.

FIG. 23 is a perspective view of a magnetoresistive element according to another comparative example.

Referring to FIG. 23, the magnetoresistive element according to the comparative example has a structure in which the protruding element PE100' is only disposed at both X-axis directional ends of the free layer FL100'. That is, the magnetoresistive element according to the comparative example has a structure similar to that of FIG. 3 from which the second portions p20 of the protruding element PE1 are removed. In this case, the protruding element PE100' has an open structure instead of the closed fence structure. In FIG. 23, PL100', PL200', SP100', and SL100' respectively denote the first pinned layer, the second pinned layer, the spacer, and the separation layer.

Figure 24:
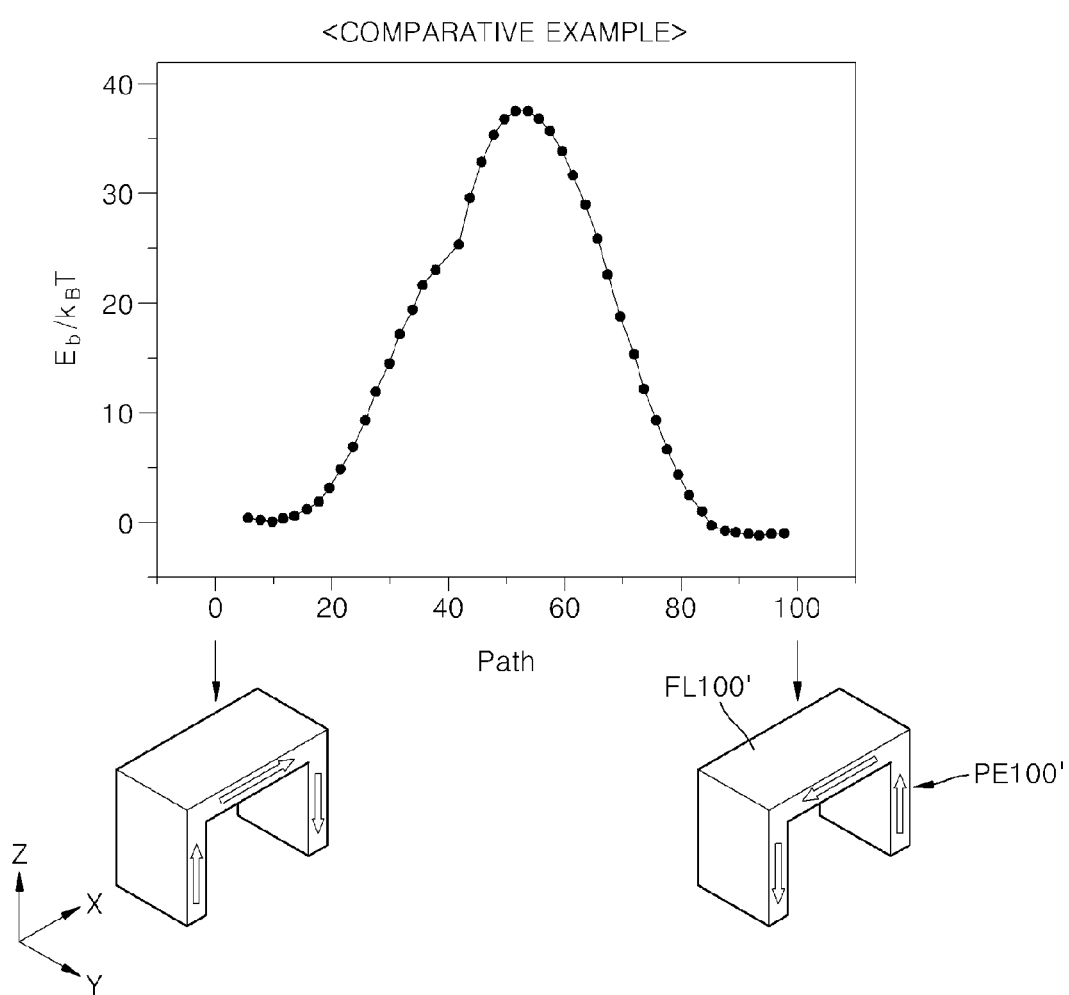
FIG. 24 is a graph showing $E_b/k_BT$ (energy barrier with respect to thermal energy) according to a switching path of a free layer when a feature size F of the magnetoresistive element of FIG. 23 is 15 nm.

FIG. 24 is a graph showing $Eb/k_BT$ (energy barrier with respect to thermal energy) according to a switching path of a free layer when a feature size F of the magnetoresistive element of FIG. 23 is 15 nm.

In FIG. 24, the materials for (thicknesses of) the free layer FL100', the separation layer SL100', the first pinned layer PL100', the spacer SP100', and the second pinned layer PL200' are CoFeB (2.4 nm), MgO (1.6 nm), CoFeB (2.4 nm), Ru (0.8 nm), and CoFe (2.4 nm), respectively. The protruding element PE100' is formed of the same material as the free layer FL100'.

Referring to FIG. 24, $Eb/k_BT$ of the center of the switching path is about 37 (a relatively low value). According to the results, when the feature size F of the magnetoresistive element having the structure as shown in FIG. 23 is about 15 nm, it is difficult to obtain excellent thermal stability. Upon comparing the results with those of the magnetoresistive element according to example embodiments (FIGS. 21 and 22), thermal stability and scaling down of the magnetoresistive element according to example embodiments may be more easily obtained compared with those of the magnetoresistive element of the comparative example.

The magnetoresistive element according to example embodiments may be applied to various magnetic devices and electronic devices. For example, the magnetoresistive element may be applied to a memory cell of a memory device. As described above, the magnetoresistive element may be suitable to be scaled down and have excellent thermal stability. Thus, if the magnetoresistive element is applied to a memory device, a high density/high performance memory device may be fabricated. If a width (i.e., a feature size) of a general magnetoresistive element is about 40 nm or less, thermal stability of a free layer (i.e., thermal stability of data stored in the free layer) cannot be obtained. However, even if the width (i.e., the feature size) of the magnetoresistive element according to the current example embodiments is reduced to about 10 nm, thermal stability of the free layer may be obtained. Thus, a small sized magnetoresistive element may be fabricated. Thus, by using such small-sized magnetoresistive element, a memory device having relatively high density with relatively high capacity per unit area may be fabricated. The magnetoresistive element according to example embodiments may also be used in various devices other than the memory device.

Figure 25:
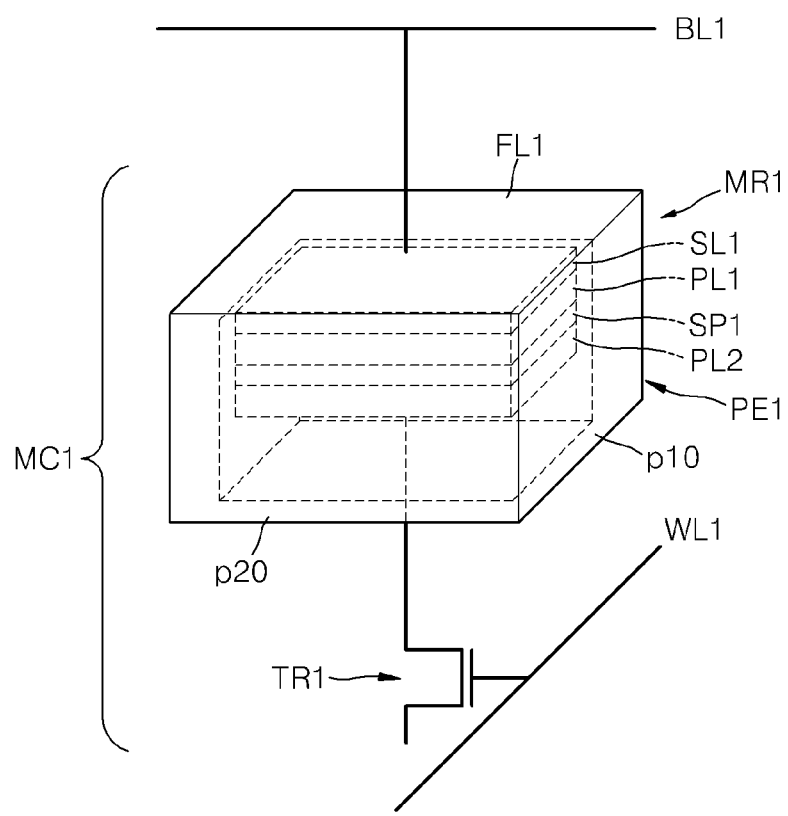
FIGS. 25 and 26 illustrate memory devices including a magnetoresistive element according to example embodiments

FIG. 25 illustrates a memory device including a magnetoresistive element according to example embodiments.

Referring to FIG. 25, the memory device according to the current example embodiments may include a memory cell MC1 that includes a magnetoresistive element MR1 and a switching element TR1 connected thereto. The magnetoresistive element MR1 may have any one of the structures described above with reference to FIGS. 1 to 16, for example, the structure of FIG. 3. The switching element TR1 may be, for example, a transistor.

The memory cell MC1 may be disposed between a bit line BL1 and a word line WL1. The bit line BL1 and the word line WL1 may cross each other, and the memory cell MC1 may be disposed at a cross-point thereof. The bit line BL1 may be connected to the magnetoresistive element MR1. The free layer FL1 of the magnetoresistive element MR1 may be electrically connected to the bit line BL1. The second pinned layer PL2 may be electrically connected to the word line WL1. The switching element TR1 may be disposed between the second pinned layer PL2 and the word line WL1. If the switching element TR1 is a transistor, the word line WL1 may be connected to a gate electrode of the switching element TR1. Through the word line WL1 and the bit line BL1, current for writing, current for reading, current for erasing, and the like may be supplied to the memory cell MC1.

Although FIG. 25 illustrates one memory cell MC1, a plurality of memory cells MC1 may be disposed to form an array. That is, a plurality of bit lines BL1 and a plurality of word lines WL1 may cross each other, and the memory cells MC1 may be respectively disposed at cross-points thereof. Because the size of the magnetoresistive element MR1 may be reduced to about 40 nm or less or about 20 nm or less according to example embodiments, the size of the memory cell MC1 may be reduced, so that a high-density/high-integration memory device may be fabricated.

The memory device of FIG. 25 may be a magnetic random access memory (MRAM). Particularly, because the spin transfer torque described above may be used in the memory device of FIG. 25, the memory device may be a spin transfer torque MRAM (STT-MRAM). In an STT-MRAM, an additional wiring (i.e., digit line) for generating an external magnetic field is not required as in a conventional MRAM, and thus the STT-MRAM may be efficiently used for relatively high integration and may be simply operated.

Figure 26:
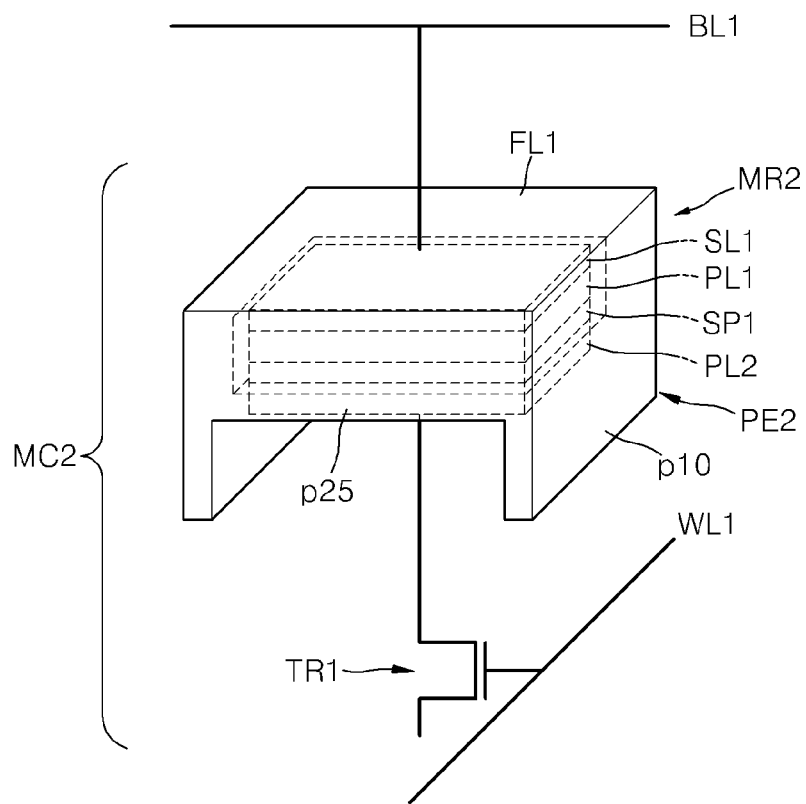

FIG. 26 illustrates a memory device including a magnetoresistive element according to other example embodiments.

The memory device according to the current example embodiments may include a memory cell MC2 that includes a magnetoresistive element MR2 and a switching element TR1 connected thereto. The magnetoresistive element MR2 may be a structure modified from the magnetoresistive element MR1 of FIG. 25, for example, the structure of FIG. 4. The structure of FIG. 26 may be the same as that of FIG. 25, except for the structure of the magnetoresistive element MR2.

In FIGS. 25 and 26, a turnover structure of the magnetoresistive elements MR1 and MR2 may be possible. In this regard, the free layer FL1 of the magnetoresistive elements MR1 and MR2 may be connected to the switching element TR1, and the second pinned layer PL2 may be connected to the bit line BL1. The structures of the magnetoresistive elements shown in FIGS. 25 and 26 may be modified in various ways.

The foregoing is illustrative of example embodiments and is not to be construed as limiting thereof. It will be understood by one of ordinary skill in the art that various changes in form and details may be made therein without departing from the spirit and scope as defined by the appended claims. For example, it would have been obvious to one of ordinary skill in the art that structures of the magnetoresistive elements shown in FIGS. 1 to 16 may be modified in various ways. Particularly, one of the two first portions p10 protruding from both first directional ends of the free layer FL1 may not be formed, or one of the two second portions p20 or p25 protruding from both second directional ends of the free layer FL may not be formed in FIGS. 1 to 4. Similarly, one of the two first portions p10' protruding from both first directional ends of the free layer FL1 may not be formed, or one of the two second portions p20' or p25' protruding from both second directional ends of the free layer FL may not be formed in FIGS. 5 to 8. This may also be applied to example embodiments described with reference to FIGS. 9 to 16. Additionally, the magnetoresistive element according to example embodiments may be applied not only to the memory devices shown in FIGS. 25 and 26 but also to another memory device and another magnetic device.

Accordingly, all such modifications are intended to be included within the scope of the disclosure as defined in the claims. It is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:
1. A magnetoresistive element, comprising:
a pinned layer having a fixed magnetization direction;

a free layer corresponding to the pinned layer, wherein the free layer has a changeable magnetization direction; and a protruding element protruding from the free layer and having a changeable magnetization direction, wherein the protruding element is shaped in the form of a tube, wherein the protruding element includes first portions along a first set of opposing sidewalls of the free layer and second portions along a second set of opposing sidewalls of the free layer alternately arranged with the first set of opposing sidewalls, and a height of the first portions and a height of the second portions in a direction non-parallel to an upper or lower surface of the free layer are different.

2. The magnetoresistive element of claim 1, wherein the protruding element has a closed fence structure.

3. The magnetoresistive element of claim 1, wherein the protruding element protrudes in a direction perpendicular to an upper or lower surface of the free layer.

4. The magnetoresistive element of claim 1, wherein the protruding element protrudes from an edge of the free layer.

5. The magnetoresistive element of claim 1, wherein the protruding element protrudes toward the pinned layer.

6. The magnetoresistive element of claim 5, wherein the protruding element surrounds the pinned layer.

7. The magnetoresistive element of claim 1, wherein the protruding element protrudes away from the pinned layer.

8. The magnetoresistive element of claim 1, wherein the protruding element has an uniform protrusion length.

9. The magnetoresistive element of claim 1, wherein the protruding element includes a first portion and a second portion, and a protrusion length of the first portion is different than a protrusion length of the second portion.

10. The magnetoresistive element of claim 1, wherein the protruding element includes first portions along a first set of opposing sidewalls of the free layer and second portions along a second set of opposing sidewalls of the free layer alternately arranged with the first set of opposing sidewalls, and the first and second portions protrude to a same height in a direction non-parallel to an upper or lower surface of the free layer.

11. The magnetoresistive element of claim 1, wherein the free layer has a rectangular shape.

12. The magnetoresistive element of claim 11, wherein the protruding element includes first portions corresponding to short sides of the free layer and second portions corresponding to long sides of the free layer, and wherein a protrusion length of the first portions is different than a protrusion length of the second portions.

13. The magnetoresistive element of claim 12, wherein the protrusion length of the second portions is less than the protrusion length of the first portions.

14. The magnetoresistive element of claim 1, wherein the free layer has an oval shape.

15. A magnetoresistive element, comprising:
a pinned layer having a fixed magnetization direction;
a free layer corresponding to the pinned layer, wherein the free layer has a changeable magnetization direction and has an oval shape; and a protruding element protruding from the free layer and having a changeable magnetization direction, wherein the protruding element is shaped in the form of a tube, wherein the protruding element includes first portions corresponding to both long-axis directional ends of the free layer and second portions corresponding to both short-axis directional ends of the free layer, and wherein a protrusion length of the first portions is identical to a protrusion length of the second portions.

16. A magnetoresistive element, comprising:
a pinned layer having a fixed magnetization direction;
a free layer corresponding to the pinned layer, wherein the free layer has a changeable magnetization direction and has an oval shape; and a protruding element protruding from the free layer and having a changeable magnetization direction, wherein the protruding element is shaped in the form of a tube, wherein the protruding element includes first portions corresponding to both long-axis directional ends of the free layer and second portions corresponding to both short-axis directional ends of the free layer, and wherein a protrusion length of the first portions is different than a protrusion length of the second portions.

17. The magnetoresistive element of claim 16, wherein the protrusion length of the second portions is less than the protrusion length of the first portions.

18. The magnetoresistive element of claim 1, wherein at least a portion of the protruding element has a protrusion length equal to or greater than about 8 nm.

19. The magnetoresistive element of claim 1, wherein the free layer and the pinned layer have in-plane magnetic anisotropy.

20. The magnetoresistive element of claim 1, wherein the free layer and the pinned layer have perpendicular magnetic anisotropy.

21. The magnetoresistive element of claim 1, further comprising:
a separation layer between the free layer and the pinned layer.

22. The magnetoresistive element of claim 1, wherein the pinned layer is a first pinned layer, and
the magnetoresistive element further comprises,
a second pinned layer spaced apart from the first pinned layer, and
a spacer between the first pinned layer and the second pinned layer.

23. The magnetoresistive element of claim 22, wherein the first pinned layer, the second pinned layer, and the spacer collectively constitute a synthetic antiferromagnetic (SAF) structure.

24. A memory device, comprising:
at least one memory cell including the magnetoresistive element according to claim 1.

25. The memory device of claim 24, wherein the at least one memory cell further includes a switching element connected to the magnetoresistive element.

26. The memory device of claim 24, wherein the memory device is a spin transfer torque magnetic random access memory (STT-MRAM).

* * * * *